(12) United States Patent
Hagihara

(10) Patent No.: US 8,593,327 B2
(45) Date of Patent: Nov. 26, 2013

(54) A/D CONVERSION CIRCUIT TO PREVENT AN ERROR OF A COUNT VALUE AND IMAGING DEVICE USING THE SAME

(75) Inventor: Yoshio Hagihara, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 13/610,062

(22) Filed: Sep. 11, 2012

(65) Prior Publication Data

US 2013/0063295 A1   Mar. 14, 2013

(30) Foreign Application Priority Data

Sep. 12, 2011 (JP) .................................. 2011-198266

(51) Int. Cl.
*H03M 1/56* (2006.01)

(52) U.S. Cl.
USPC ..................... 341/169; 250/208.1; 250/214.1; 250/214 R; 327/270; 327/291; 327/136; 327/524; 348/302; 348/234; 348/300; 348/164; 348/E9.053; 348/E5.091; 348/E5.031; 341/155

(58) Field of Classification Search
USPC ........ 341/155–169; 250/208.1, 214.1, 214 R; 327/270, 291, 136, 524; 348/302, 294, 348/234, 300, E9.053, E5.031, E5.091, 164
See application file for complete search history.

(56) References Cited

U.S. PATENT DOCUMENTS

| | | | |
|---|---|---|---|
| 6,801,150 B2 * | 10/2004 | Honda | 341/161 |
| 7,324,033 B2 * | 1/2008 | Asayama et al. | 341/145 |
| 7,522,082 B2 * | 4/2009 | Asayama et al. | 341/145 |
| 7,612,320 B2 * | 11/2009 | Hagihara | 250/208.1 |
| 7,859,583 B2 * | 12/2010 | Kawaguchi | 348/308 |
| 7,936,294 B2 * | 5/2011 | Asayama et al. | 341/145 |
| 7,999,871 B2 * | 8/2011 | Hagihara | 348/308 |
| 8,310,390 B2 * | 11/2012 | Hagihara | 341/166 |
| 8,339,300 B2 * | 12/2012 | Asayama et al. | 341/145 |
| 8,476,570 B2 * | 7/2013 | Hagihara | 250/208.1 |
| 2011/0095928 A1 * | 4/2011 | Hagihara | 341/166 |
| 2011/0186713 A1 * | 8/2011 | Hagihara | 250/208.1 |
| 2012/0138772 A1 * | 6/2012 | Hagihara | 250/208.1 |
| 2012/0229666 A1 * | 9/2012 | Hagihara | 348/222.1 |
| 2012/0249850 A1 * | 10/2012 | Hagihara | 348/302 |
| 2012/0318958 A1 * | 12/2012 | Hagihara et al. | 250/208.1 |

FOREIGN PATENT DOCUMENTS

JP      2011-023887 A    2/2011

* cited by examiner

*Primary Examiner* — Lam T Mai
(74) *Attorney, Agent, or Firm* — Westerman, Hattori, Daniels & Adrian, LLP

(57) ABSTRACT

In an A/D conversion circuit and an imaging device, an upper counter acquires a first upper count value by performing counting using one output signal, which constitutes a first lower phase signal output from a delay circuit, as a count clock. After values of bits constituting the first upper count value are inverted, the upper counter acquires a second upper count value by performing counting using one output signal, which constitutes a second lower phase signal output from the delay circuit, as a count clock, and further performing counting based on an upper count clock output from a lower counter. A modification unit modifies a logic state of a count clock to a predetermined state when the count clock of the upper counter is switched.

5 Claims, 29 Drawing Sheets

A/D CONVERSION CIRCUIT TO PREVENT AN ERROR OF A COUNT VALUE AND IMAGING DEVICE USING THE SAME

BACKGROUND

1. Field of the Invention

The present invention relates to an A/D conversion circuit and an imaging device provided with the A/D conversion circuit.

The application is based on and claims the benefit of priority from prior Japanese Patent Application No. 2011-198266, filed Sep. 12, 2011, the entire contents of which are incorporated herein.

2. Description of Related Art

FIG. 27 illustrates a part of a conventional A/D conversion circuit for measuring a time, which is called a time to digital converter (TDC)-type A/D conversion circuit. The circuit illustrated in FIG. 27 includes a ring-like delay circuit 201 in which a plurality of delay elements NAND0 and INV1 to INV8 are connected to one another in a ring shape, a latch circuit 202 for holding the output of the ring-like delay circuit 201, a binarizing circuit (a full-encoder circuit) 203 for binarizing values held by the latch circuit 202, a counter circuit 204 for counting one of the outputs of the ring-like delay circuit 201 as a count clock, and a memory circuit 205 for holding the outputs of the binarizing circuit 203 and the counter circuit 204.

Next, an A/D conversion operation will be described. FIG. 28 illustrates the operation timing of the circuit illustrated in FIG. 27. A logic state of a starting pulse StartP changes from an L state to an H state, so that the logic states of the delay elements constituting the ring-like delay circuit 201 sequentially change. Accordingly, a pulse circulates in the ring-like delay circuit 201. After a predetermined time has lapsed, the latch circuit 202 holds (latches) the output of the ring-like delay circuit 201. As illustrated in FIG. 28, the output of the ring-like delay circuit 201 corresponds to any one of nine states (state 0 to state 8). The output (a lower phase signal) of the ring-like delay circuit 201 held (latched) by the latch circuit 202 is fully encoded (simultaneously encoded) by the binarizing circuit 203 to generate binarized data (a lower count value). The counter circuit 204 performs counting using the output of the delay element INV8 as a count clock to generate a count value (an upper count value). The lower count value and the upper count value are held in the memory circuit 205 to be output to the subsequent circuit as digital data.

The above-mentioned A/D conversion circuit is applied to, for example, an imaging device. Japanese Unexamined Patent Application, First Publication NO. 2011-23887 discloses an example in which an A/D conversion circuit is arranged in a column part provided to correspond to each of pixel columns to perform A/D conversion with respect to signals output from pixels.

The control unit 1020 controls the vertical selection unit 1012, the read current source unit 1005, the clock generation unit 1018, the ramp unit 1019, the column processing unit 1015, the horizontal selection unit 1014, the output unit 1017, and the like. The imaging unit 1002 has a configuration in which unit pixels 1003 having photoelectric conversion elements are arranged in a matrix form, generates pixel signals corresponding to the amount of incident electromagnetic waves, and outputs the pixel signals to vertical signal lines 1013 provided to columns.

The vertical selection unit 1012 controls row addresses or row scanning of the imaging unit 1002 through row control lines 1011 when the unit pixels 1003 of the imaging unit 1002 are driven. The horizontal selection unit 1014 controls column addresses or column scanning of the column A/D conversion sections 1016 of the column processing unit 1015. The read current source unit 1005 is a current source for reading the pixel signals from the imaging unit 1002 as voltage signals.

The column processing unit 1015 includes the column A/D conversion sections 1016 provided to the columns of the imaging unit 1002. The column A/D conversion section 1016 converts an analog signal, which is the pixel signal output for each column from each unit pixel 1003 of the imaging unit 1002, into digital data, and outputs the digital data. The clock generation unit 1018, for example, includes a ring-like delay circuit (corresponding to the ring-like delay circuit 201 of FIG. 27), and outputs a count clock. The ramp unit 1019, for example, includes an integration circuit or a DAC circuit, and generates a reference signal which changes in an inclined manner through time.

The horizontal selection unit 1014 includes a shift register, a decoder and the like, and controls the column addresses or column scanning of each column A/D conversion section 1016 in the column processing unit 1015. Accordingly, the A/D converted digital data is sequentially output to the output unit 1017 through horizontal signal lines.

Next, the configuration of the column A/D conversion section 1016 will be described. Each of the column A/D conversion sections 1016 has the same configuration, and includes a comparison unit 1110 and a counter 1101 (corresponding to the counter circuit 204 of FIG. 27).

The comparison unit 1110 includes a comparator circuit, and compares the pixel signal output from the unit pixel 1003 of the imaging unit 1002 with the reference signal. For example, the comparison unit 1110 outputs a High level when the reference signal is larger than the pixel signal, and outputs a Low level when the reference signal is smaller than the pixel signal. The counter 1101 includes a binary counter circuit, and measures a comparison time until the comparison unit 1110 completes the comparison. Accordingly, a measurement value of the comparison time corresponding to the amplitude of the pixel signal is obtained as a count value of the counter 1101.

Next, the A/D conversion operation will be described. The detailed operation of the unit pixel 1003 will be omitted. However, a reset level and a signal level are output from the unit pixel 1003 as the pixel signal.

First, after the reset level is stably read from the unit pixel 1003, the comparison unit 1110 compares the reference signal with the pixel signal. The counter 1101 performs counting in an up-count mode, and a count value at the time of completion of the comparison is digital data of the reset level. Then, the count value of the counter 1101 is inverted.

Next, after the signal level is stably read from the unit pixel 1003, the comparison unit 1110 compares the reference signal with the pixel signal. The counter 1101 performs the counting in the up-count mode, and a count value of the counter 1101 at the time of completion of the comparison is digital data of a signal component (a signal obtained by subtracting the reset level from the signal level).

In the imaging device illustrated in FIG. 29, the counter 1101 corresponding to the counter circuit 204 illustrated in FIG. 27 performs the counting, so that an upper count value constituting an upper bit of digital data is obtained. However, since the imaging device has no configuration corresponding to the latch circuit 202 and the binarizing circuit 203 illustrated in FIG. 27, it is not possible to obtain a lower count value constituting a lower bit of digital data.

Circuits for obtaining an upper count value and a lower count value are arranged at parts corresponding to the column A/D conversion sections 1016 of FIG. 29, so that it is possible to obtain digital data with high accuracy. As an example of such a circuit arrangement, an upper counter for obtaining the upper count value and a lower counter for obtaining the lower count value are considered to be arranged at the parts corresponding to the column A/D conversion sections 1016.

In this case, the upper counter performs counting using one output signal of a plurality of delay elements as a count clock, and the lower counter performs counting using a signal corresponding to the states of output signals of a plurality of delay elements as a count clock. When shift-up or shift-down has occurred in the most significant bit (MSB) of the lower count value counted by the lower counter, the upper counter performs counting using the MSB output signal of the lower counter as a count clock in order to adjust the upper counter value by the shift-up or shift-down.

Therefore, it is necessary to switch the counter clock input to the upper counter between one output signal of the plurality of delay elements and the MSB output signal of the lower counter. However, the switching of the counter clock has the following problems. Hereinafter, the case in which the upper counter performs counting at the falling of the count clock (the upper counter performs counting when the count clock has changed from a High state (hereinafter referred to as an H state) to a Low state (hereinafter referred to as an L state)) will be described as an example.

The A/D conversion operation is an asynchronous operation, and a logic state of the count clock (one output signal of the plurality of delay elements) at a time point (a comparison completion time point) at which the comparison between the reference signal and the pixel signal has been completed is the H state or the L state. For example, when the logic state of the count clock at the comparison completion time point is the H state and a count clock in the L state is input from the lower counter to the upper counter through count clock switching, the logic state of the count clock changes from the H state to the L state before and after the switching, resulting in a change in the upper count value of the upper counter. Meanwhile, when the logic state of the count clock at the comparison completion time point is the L state and a count clock in the L state is input from the lower counter to the upper counter through the count clock switching, the logic state of the count clock does not change before and after the switching, resulting in no change in the upper count value of the upper counter.

The upper counter performs the counting according to the presence or absence of shift-up or shift-down in the state of the count clock output from the lower counter, that is, the lower count value. However, as described above, the presence or absence of a change in the upper count value of the upper counter depends on the logic state of the count clock (one output signal of the plurality of delay elements) before the switching as well as the logic state of the count clock (the count clock output from the lower counter) after the switching. Therefore, an error may occur in the upper count value of the upper counter according to the logic state of the count clock (one output signal of the plurality of delay elements) at the comparison completion time point.

SUMMARY OF THE INVENTION

According to a first aspect of the present invention, an A/D conversion circuit includes a reference signal generation unit, a comparison unit, a delay circuit, a latch unit, an arithmetic unit, a lower counter, an upper counter, and a modification unit. The reference signal generation unit generates a reference signal increasing or decreasing through time. The comparison unit compares an analog signal to be subjected to A/D conversion with the reference signal, and completes a comparison process at a timing at which the reference signal satisfies a predetermined condition with respect to the analog signal. The delay circuit includes a plurality of delay elements connected to one another to delay a pulse signal, and outputs a lower phase signal being configured with output signals from the plurality of delay elements. The latch unit latches a second lower phase signal at a second timing at which the comparison process for a second analog signal is completed after latching a first lower phase signal at a first timing at which the comparison process for a first analog signal is completed. The arithmetic unit generates a first lower count signal in response to the first lower phase signal held by the latch unit, and then generates a second lower count signal in response to the second lower phase signal held by the latch unit. The lower counter includes a first binary counter that acquires a first lower count value by performing counting using the first lower count signal as a count clock and inverts values of each bits constituting the first lower count value, and then acquires a second upper count value by performing counting using the second lower count signal as a count clock and outputs an upper count clock based on a flag bit of the second lower count value. The upper counter is configured with a second binary counter that acquires a first upper count value by performing counting using one output signal, which constitutes the first lower phase signal output from the delay circuit, as a count clock and inverts values of each bits constituting the first upper count value, and then acquires a second upper count value by performing counting using one output signal, which constitutes the second lower phase signal output from the delay circuit, as a count clock, and further performing counting based on the upper count clock. The modification unit modifies a logic state of a count clock to a predetermined state when the count clock of the upper counter is switched. In the A/D conversion circuit according to the first aspect of the present invention, digital data corresponding to a difference between the first analog signal and the second analog signal is acquired.

Furthermore, according to a second aspect of the present invention, in the A/D conversion circuit, the upper counter further has a data setting function of setting an upper count value of the second binary counter when performing counting using the one output signal, which constitutes the first lower phase signal output from the delay circuit, as the count clock.

Furthermore, according to a third aspect of the present invention, the A/D conversion circuit further includes an adjustment unit that outputs an adjustment signal for adjusting the lower count value held by the first binary counter or the upper count value held by the second binary counter to the first binary counter or the second binary counter, as a count clock.

Furthermore, according to a fourth aspect of the present invention, in the A/D conversion circuit, the delay circuit is a ring-like delay circuit in which the plurality of delay elements are connected in a ring shape.

Furthermore, according to a fifth aspect of the present invention, an imaging device includes an imaging unit in which a plurality of pixels including a photoelectric conversion element are arranged, wherein the plurality of pixels output a first pixel signal corresponding to a reset level at a first time and output a second pixel signal corresponding to an amount of an incident electromagnetic wave at a second time, and the A/D conversion circuit, wherein the first pixel signal is used as the first analog signal and the second pixel signal is used as the second analog signal.

BEST MODE FOR CARRYING OUT THE INVENTION

Hereinafter, embodiments of the present invention will be described with reference to the accompanying drawings.

First Embodiment

Figure 1:
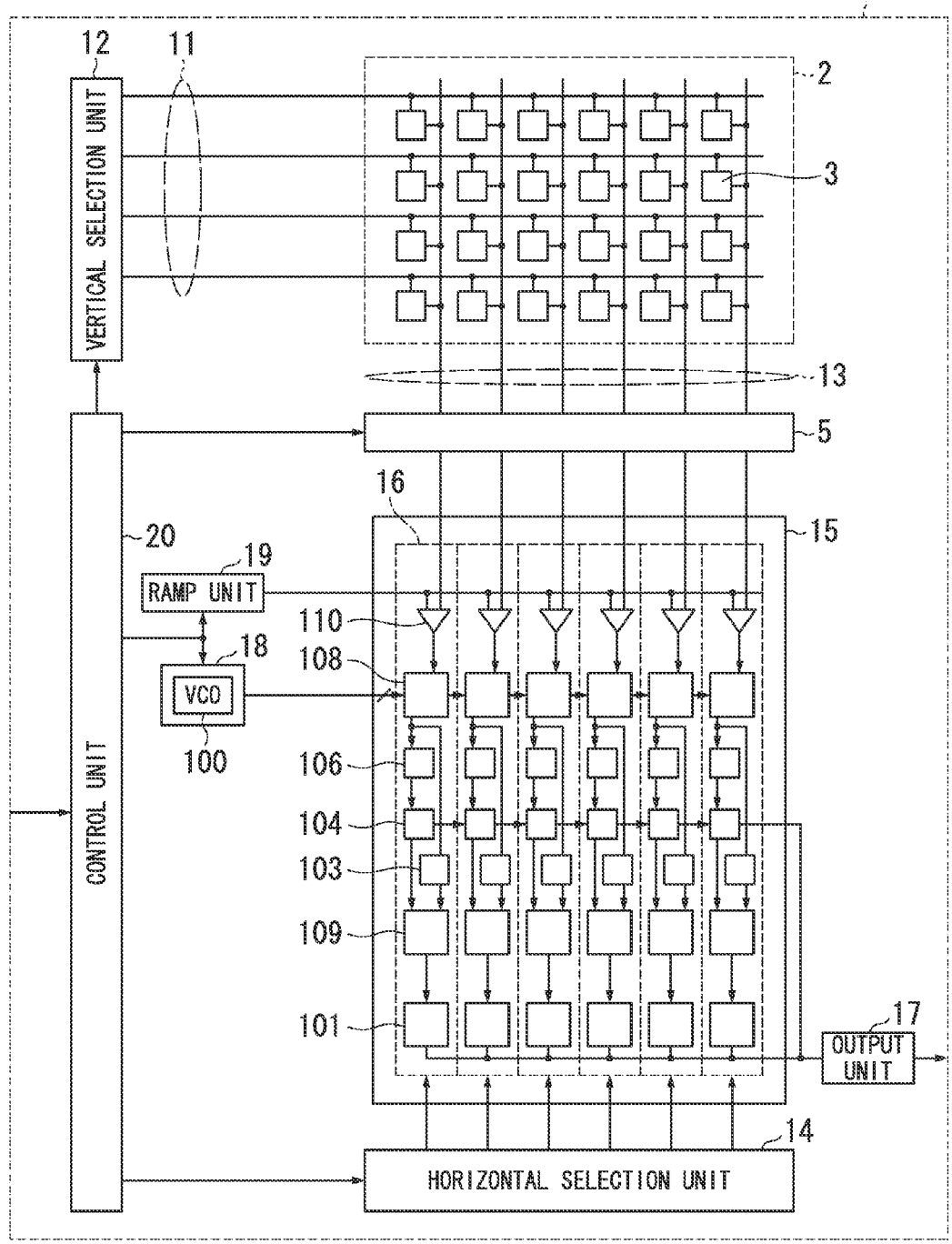
FIG. 1 is a block diagram illustrating a configuration of an imaging device according to a first embodiment of the present invention.

First, a first embodiment of the present invention will be described. FIG. 1 illustrates an example of the configuration of a (C)MOS imaging device according to the present embodiment. An imaging device 1 illustrated in FIG. 1 includes an imaging unit 2, a vertical selection unit 12, a read current source unit 5, a clock generation unit 18, a ramp unit 19 (a reference signal generation unit), a column processing unit 15, a horizontal selection unit 14, an output unit 17, and a control unit 20.

The imaging unit 2 has a configuration in which a plurality of unit pixels 3 are arranged in a matrix form to generate and output signals corresponding to the amount of incident electromagnetic waves. The vertical selection unit 12 selects each row of the imaging unit 2. The read current source unit 5 reads signals from the imaging unit 2 as voltage signals. The clock generation unit 18 generates each clock. The ramp unit 19 generates a reference signal (a ramp wave) that increases or decreases through time. The column processing unit 15 is connected to the ramp unit 19 through a reference signal line. The horizontal selection unit 14 reads A/D converted data to a horizontal signal line. The output unit 17 is connected to the horizontal signal line. The control unit 20 controls these units.

In FIG. 1, the imaging unit 2 including unit pixels 3 of 4 rows 6 columns will be described for the purpose of convenience. Actually, unit pixels 3 of several tens or several tens of thousands are arranged in rows and columns of the imaging unit 2. Although not illustrated in the drawing, the unit pixels 3 constituting the imaging unit 2 include a photoelectric conversion element such as a photodiode, a photogate or a phototransistor and so on, and a transistor circuit.

Hereinafter, each unit will be described in detail. The imaging unit 2 has a configuration in which the unit pixels 3 are two-dimensionally arranged in 4 rows 6 columns and row control lines 11 are arranged at the rows with respect to the pixel arrangement of 4 rows 6 columns. Each one end of row control line 11 is connected to an output terminal corresponding to each row of the vertical selection unit 12. The vertical selection unit 12 includes a shift register, a decoder and so on, and controls row addresses or row scanning of the imaging unit 2 through the row control lines 11 when each the unit pixels 3 of the imaging unit 2 is driven. Furthermore, vertical signal lines 13 are arranged at the columns with respect to the pixel arrangement of the imaging unit 2.

The read current source unit 5 includes a current source configured to read signals from the imaging unit 2 as voltage signals.

The column processing unit 15, for example, includes column A/D conversion sections 16 provided to the pixel columns of the imaging unit 2, that is, the vertical signal lines 13, and converts analog pixel signals into digital data, wherein the analog pixel signals are read from each the unit pixels 3 of the imaging unit 2 for pixel column through the vertical signal lines 13. In the present embodiment, the column A/D conversion sections 16 are arranged with respect to the pixel columns of the imaging unit 2 in one-to-one. This is for illustrative purposes only. The present invention is not limited to such an arrangement relation. For example, it is possible to employ a configuration in which one column A/D conversion section 16 is arranged with respect to a plurality of pixel columns and is used among the plurality of pixel columns in a time division. The column processing unit 15 forms an analog-digital conversion unit for converting an analog pixel signal, which is read from the unit pixel 3 of a selection pixel row of the imaging unit 2, into digital pixel data, together with the ramp unit 19 and the clock generation unit 18 which will be described later. The column processing unit 15, specifically, the column A/D conversion section 16, will be described in detail later.

The ramp unit 19, for example, includes an integration circuit, generates a ramp wave which an amplitude changes in an inclined state through time, and supplies the ramp wave to the input terminals of comparison units 110 through a reference signal line under the control of the control unit 20. The ramp unit 19 may also use a DAC circuit as well as the integration circuit. However, when the ramp wave is digitally generated using the DAC circuit, the ramp unit 19 is necessary to subdivide the step of the ramp wave or employ a configuration equivalent thereto.

The horizontal selection unit 14 includes a shift register, a decoder and so on, and controls column addresses or column scanning of the column A/D conversion sections 16 of the column processing unit 15. Under the control of the horizontal selection unit 14, digital data A/D converted by the column A/D conversion sections 16 is sequentially read to the horizontal signal line.

Figure 27:
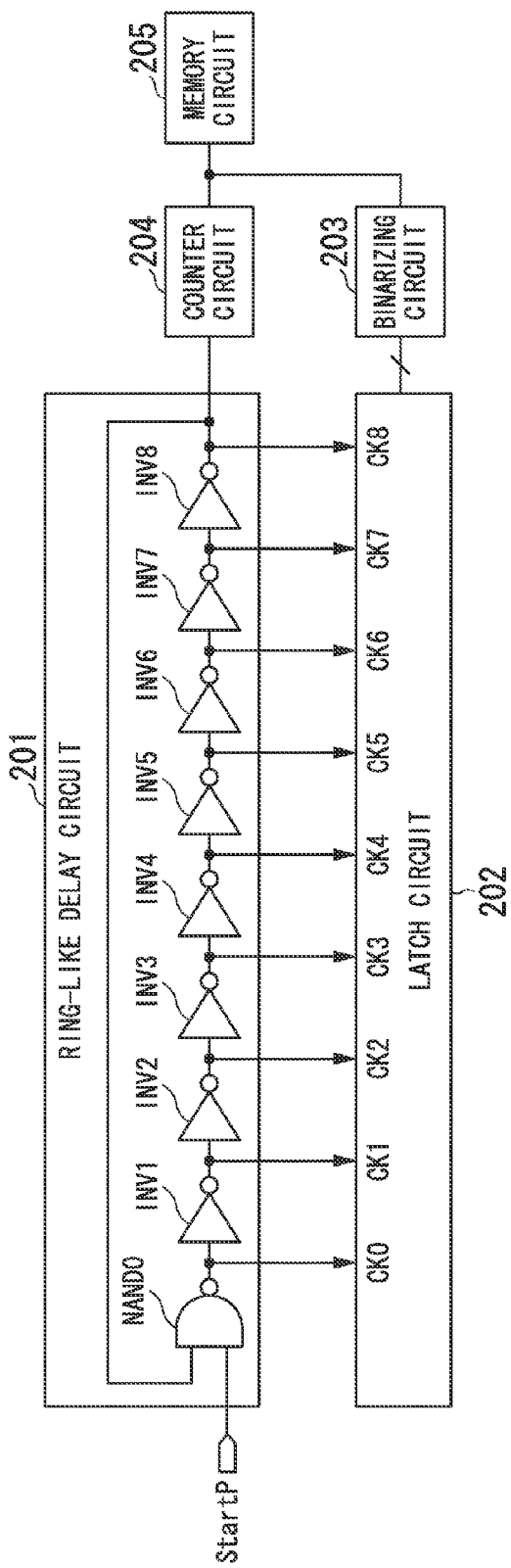
FIG. 27 is a block diagram illustrating a partial configuration of a conventional A/D conversion circuit.
Figure 28:
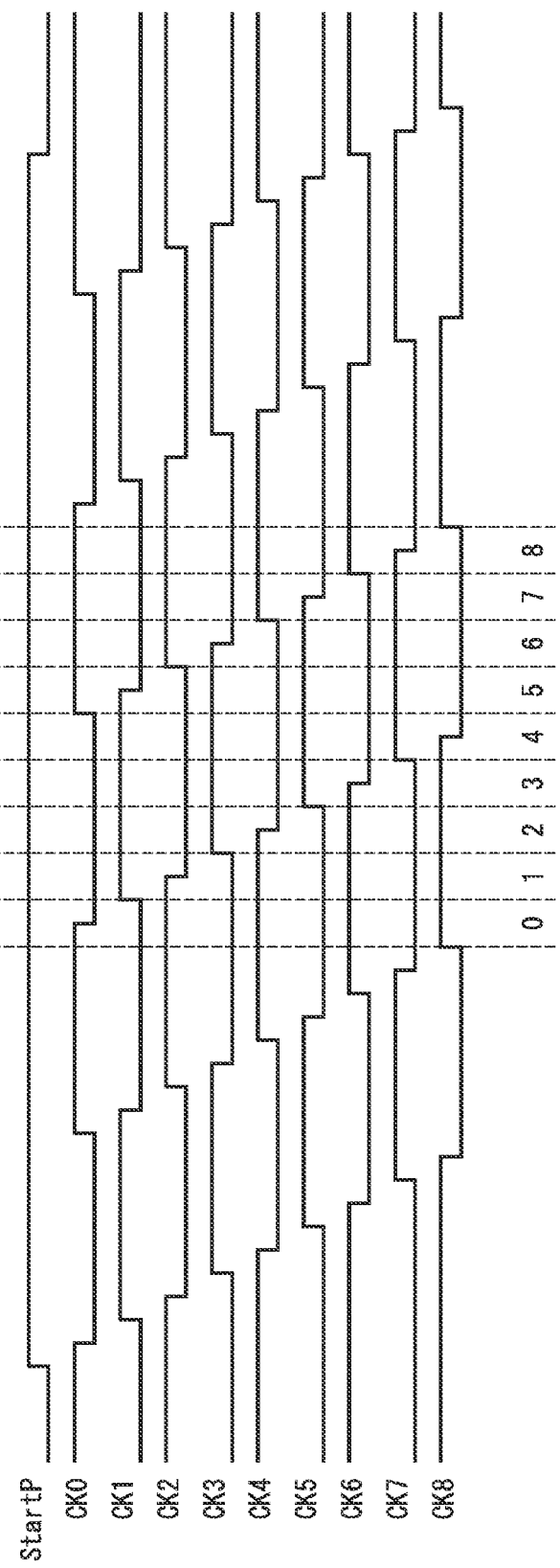
FIG. 28 is a timing chart illustrating a conventional operation.
Figure 29:
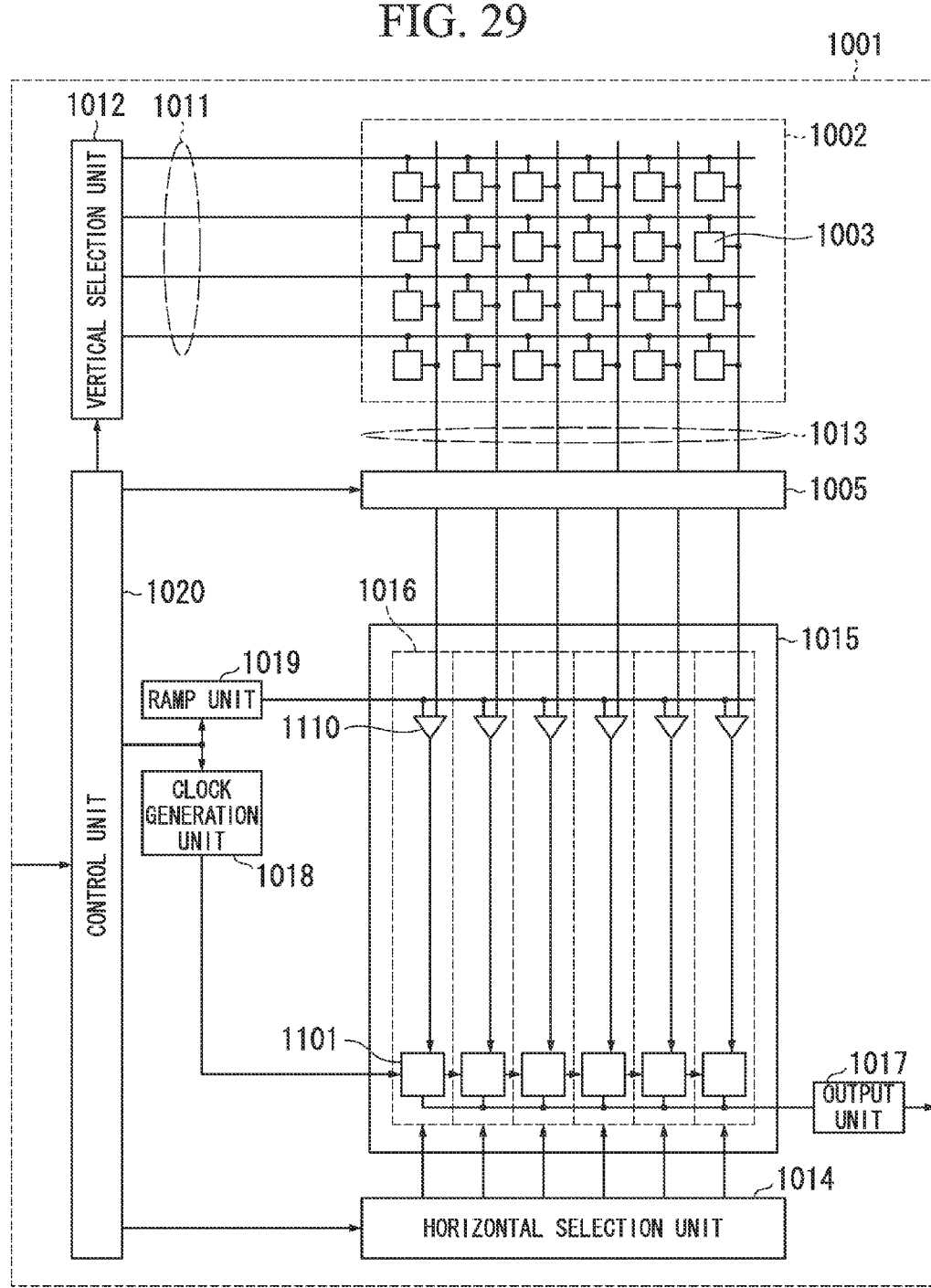
FIG. 29 is a block diagram illustrating a configuration of a conventional imaging device.

The clock generation unit 18 includes a VCO100, which is a delay circuit to which a plurality of delay units (inversion elements) are connected. If the delay units constituting the VCO100, for example, are connected in eight stages, the VCO100 outputs eight-phase clocks CK0, CK1, CK2, CK3, CK4, CK5, CK6, and CK7. The signals output from the delay units constitute lower phase signals which will be described later. The delay circuit constituting the VCO100 may also be a ring-like delay circuit having a configuration in which a plurality of inversion elements are connected to one another in a ring shape. In such a case, similarly to a symmetric oscillation circuit (for example, the ring-like delay circuit 201 illustrated in FIG. 27), the ring-like delay circuit itself includes an odd number of delay units, but preferably, the output thereof uses an even number (specifically, a power of 2) of asymmetric oscillation circuits. Moreover, the ring-like delay circuit itself may also use a ring delay line (RDL) circuit including an even number (specifically, a power of 2) of delay units, or the ring-like delay circuit itself may also use a full differential type oscillation circuit including an even number (specifically, a power of 2) of delay units, in which the output of final terminals of full differential type inversion circuits constituting the delay units is fed back to an opposite side of the input of initial terminals thereof.

The output unit 17 outputs binarized digital data. Furthermore, the output unit 17, for example, may also have a signal processing function such as black level adjustment, column variation correction, or color treatment, in addition to a buffering function. Moreover, the output unit 17 may convert n bit-parallel digital data to serial data and output the serial data.

The control unit 20 includes a functional block of a timing generator (TG) configured to supply clocks or predetermined timing pulse signals necessary for the operations of the ramp unit 19, the clock generation unit 18, the vertical selection unit 12, the horizontal selection unit 14, and the output unit 17, and a functional block configured to communicate with the TG.

Next, the configuration of the column A/D conversion section 16 will be described. Each column A/D conversion section 16 compares the analog pixel signal, which is read from each unit pixel 3 of the imaging unit 2 through the vertical signal line 13, with the ramp wave for A/D conversion, which is supplied from the ramp unit 19, thereby generating a pulse signal having the amplitude (pulse width) in a time axis direction which corresponds to each amplitude of a reset level (a reference level) and a signal level. Then, A/D conversion is performed by converting data corresponding to a pulse width period of the pulse signal to digital data corresponding to the amplitude of the pixel signal.

Hereinafter, a detailed configuration of the column A/D conversion section 16 will be described. The column A/D conversion section 16 is provided to each column, and six column A/D conversion sections 16 are provided in FIG. 1. The column A/D conversion sections 16 of the columns have the same configuration. Each column A/D conversion section 16 includes a lower count unit having the comparison unit 110, a latch unit 108, an arithmetic unit 106, and a lower counter 104, a switching unit 109 configured to switch a count clock, an upper counter 101 serving as an upper count unit, and a modification unit 103. Here, the lower counter 104 and the upper counter 101 are based on a binary counter circuit having a latch function.

The comparison unit 110 compares a signal voltage corresponding to an analog pixel signal output from the unit pixel 3 of the imaging unit 2 through the vertical signal line 13 with the ramp wave supplied from the ramp unit 19, thereby converting the amplitude of the pixel signal into information (a pulse width of a pulse signal) of the time axis direction. The comparison output of the comparison unit 110, for example, is at a High level (H level) when the ramp voltage is larger than the signal voltage, and is at a Low level (L level) when the ramp voltage is equal to or less than the signal voltage.

Figure 3:
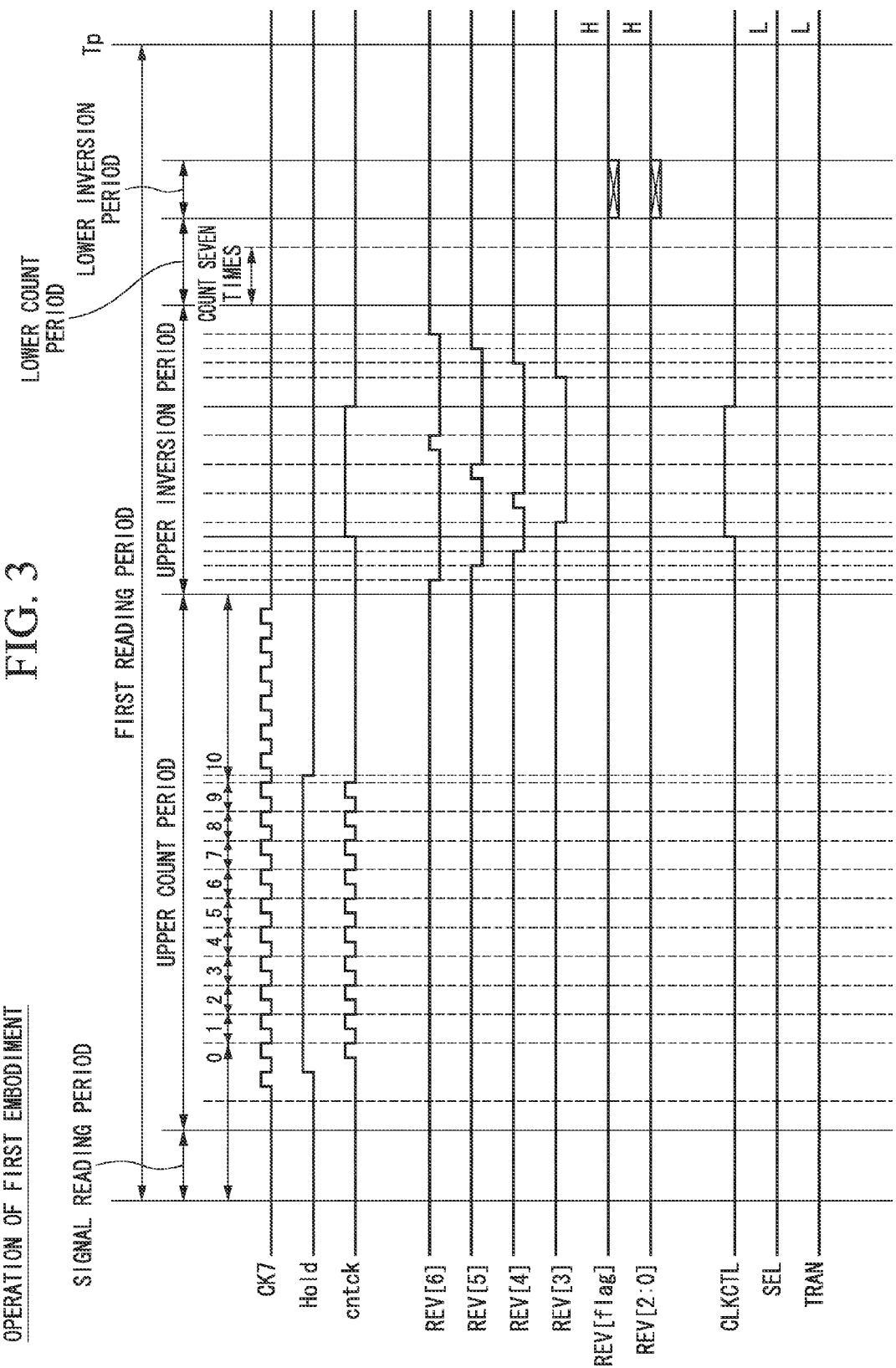
FIG. 3 is a timing chart illustrating an operation at the time of subtraction in a first embodiment of the present invention.

The latch unit 108 receives the comparison output of the comparison unit 110, and latches (holds/stores) the logic state (the lower phase signal) generated by the clock generation unit 18 at the inversion timing of the comparison output. The arithmetic unit 106 generates a lower count signal serving as a count clock of the lower counter 104 based on the lower phase signal latched by the latch unit 108. The lower counter 104 performs counting using the lower count signal as the count clock. Accordingly, a lower count value constituting a lower bit of digital data is obtained. As illustrated in FIG. 3, the lower counter 104 includes a lower counter 104a and a lower counter 104b.

The upper counter 101 performs counting using a clock signal (an upper count signal), which is input through the latch unit 108 after being output from the clock generation unit 18, as a count clock (a first count clock). Furthermore, the upper counter 101 performs counting using the output signal of the lower counter 104 as a count clock (a second count clock) based on digit-up or digit-down of the lower count value. Accordingly, an upper count value constituting an upper bit of digital data is obtained.

The switching unit 109 switches a counter clock, which is input to the upper counter 101, between a first count clock output through the latch unit 108 and a second count clock output from the lower counter 104. The modification unit 103 modifies a logic state of the count clock, which is output from the latch unit 108 at the time of the switching of the count clock, to a predetermined logic state.

Here, the lower phase signal latched by the latch unit 108, for example, is 8-bit data.

In such a case, the lower counter 104 including the lower counters 104a and 104b is a 4-bit counter circuit. The lower counter 104a counts lower count values of a first bit to a third bit, and the lower counter 104b counts a lower count value of a fourth bit (a bit for a flag). Furthermore, the upper counter 101, for example, is a 9-bit counter circuit. However, these are for illustrative purposes only, and the present invention is not limited thereto.

Next, the operations of the present embodiment will be described. Here, a basic operation of the unit pixel 3 will not be described. However, a reset level and a signal level are output from the unit pixel 3.

The A/D conversion is performed as follows. For example, a ramp wave falling with a predetermined slope is compared with each voltage of a reset level or a signal level, which is a pixel signal from the unit pixel 3. A period until each voltage of the reset level or the signal level coincides with the ramp wave (a ramp voltage) from the generation time point of a ramp wave to be used in a comparison process is counted by a clock (for example, CK7) from the VCO100 output through the latch unit 108 and is measured in the logic states of multi-phase clocks (CK0 to CK7) having a constant phase difference, resulting in the achievement of digital data corresponding to each amplitude of the reset level or the signal level. Preferably, the number (8 in the present example) of clock signals from the VCO is a power of 2.

Here, a reset level including noise of a pixel signal is read from each unit pixel 3 of a selection row of the imaging unit 2 as an analog pixel signal in the first read operation, and then a signal level is read in the second read operation. Next, the reset level and the signal level are input to the column A/D conversion section 16 through the vertical signal line 13 in time series. However, the signal level may be read in the first read operation and then the reset level may be read in the second read operation. Hereinafter, the first and second read operations and subsequent subtraction (a CDS process) will be described in detail. For the purpose of convenience, a description will be provided for a case in which a count mode of the upper counter 101 is an up-count mode, a count mode of the lower counter 104 is a down-count mode, and the upper counter 101 and the lower counter 104 perform counting at a falling edge timing of a count clock.

<First Reading>

The first reading from the unit pixel 3 of an arbitrary pixel row to the vertical signal line 13 is stabilized, and then the control unit 20 supplies control data for ramp wave generation to the ramp unit 19. After the control data is received, the ramp unit 19 outputs a ramp wave as a comparison voltage to be applied to the input terminals of the comparison units 110, wherein the waveform of the ramp wave temporally changes in a ramp form as a whole. The comparison unit 110 compares the ramp wave with the reset level. During this time, the upper counter 101 performs counting using a clock output from the VCO100 as a count clock. Preferably, the output start timing of the clock signal of the VCO100 and the output start timing of the ramp wave are approximately simultaneous. However, the present invention is not limited thereto.

The comparison unit 110 compares the ramp wave applied from the ramp unit 19 with the reset level, and inverts comparison output when both voltages approximately coincide with each other (at a first timing). At the first timing, the latch unit 108 holds the logic state of the VCO100 as the first lower phase signal. Furthermore, at the first timing, the upper counter 101 stops the count operation to hold the logic state as the first upper count value. If a predetermined period passes, the control unit 20 stops the supply of the control data to the ramp unit 19 and the output from the clock generation unit 18. Accordingly, the ramp unit 19 stops generating the ramp wave.

Subsequently, the arithmetic unit 106 generates a first lower count signal which is a clock signal corresponding to the first lower phase signal held by the latch unit 108, and outputs the first lower count signal to the lower counter 104. The lower counter 104a performs counting using the first lower count signal as a count clock and the lower counter 104b performs counting using an output signal of a third bit of the lower counter 104a as a count clock. Accordingly, a first lower count value is obtained.

Values of bits constituting the first lower count value held by the lower counter 104 and the first upper count value held by the upper counter 101 are inverted after counting of the count values are completed.

<Second Reading>

Subsequently, at the time of second reading, a signal level corresponding to the amount of incident light of each unit pixel 3 is read, and an operation similar to that of the first reading is performed. The second reading from the unit pixel 3 of an arbitrary pixel row to the vertical signal line 13 is stabilized, and then the control unit 20 supplies control data for ramp wave generation to the ramp unit 19. After the control data is received, the ramp unit 19 outputs a ramp wave as a comparison voltage to be applied to the input terminals of the comparison units 110, wherein the waveform of the ramp wave temporally changes in a ramp form as a whole. The comparison unit 110 compares the ramp wave with the signal level. During this time, the upper counter 101 performs counting using a clock output from the VCO100 as a count clock. Preferably, the output start timing of the clock signal of the VCO100 and the output start timing of the ramp wave are approximately simultaneous. However, the present invention is not limited thereto.

The comparison unit 110 compares the ramp wave applied from the ramp unit 19 with the signal level, and inverts comparison output when both voltages approximately coincide with each other (at a second timing). At the second timing, the latch unit 108 holds the logic state of the VCO100 as the second lower phase signal. Furthermore, at the second timing, the upper counter 101 stops the count operation to hold the logic state as the second upper count value. Accordingly, an upper count value corresponding to the difference between the reset level and the signal level is obtained. If a predetermined period passes, the control unit 20 stops the supply of the control data to the ramp unit 19 and the output from the clock generation unit 18. Accordingly, the ramp unit 19 stops generating the ramp wave.

Subsequently, the arithmetic unit 106 generates a second lower count signal which is a clock signal corresponding to the second lower phase signal held by the latch unit 108, and outputs the second lower count signal to the lower counter 104a. The lower counter 104a performs counting using the second lower count signal as a count clock, and the lower counter 104b performs counting using an output signal of a third bit of the lower counter 104a as a count clock. Accordingly, a second lower count value, which is a lower count value corresponding to the difference between the reset level and the signal level, is obtained.

Subsequently, the count clock input to the upper counter 101 is switched. In the present embodiment, at the time of the switching of the count clock, the switching of the count clock, the adjustment of the upper count value based on digit-up and digit-down of the lower count value, and the adjustment of the upper count value based on binary subtraction using a complement of 2 are all performed. The adjustment of the upper count value based on the binary subtraction using the complement of 2 will be described later. First, the modification unit 103 allows a count clock (an output signal of the modification unit 103) before the switching to be in an H state, and then the switching unit 109 switches the count clock. When the second count clock after the switching is in an L state (an inverted output of the lower counter 104b is in an L state), 1 is added to the upper count value of the upper counter 101. When the second count clock is in an H state (an inverted output of the lower counter 104b is in an H state), no value is added to the upper count value of the upper counter 101.

Here, as the second count clock, an L state is output when digit-up or digit-down occurs in the lower count value and an H state is output when no digit-up or digit-down occurs in the lower count value. Furthermore, in the present embodiment, the second count clock, which is the count clock after the switching, is the inverted output of the lower counter 104b. The modification unit 103 modifies the count clock to be in the H state, so that 1 is added to the upper count value of the upper counter 101 only when the second count clock is in the L state, resulting in the prevention of an error of the count value regardless of the logic state (an output signal of the latch unit 108) before the switching.

In this way, the second lower count value and the second upper count value corresponding to the difference between the reset level and the signal level are obtained. At last, the values of the bits constituting the second lower count value held by the lower counter 104 are inverted, and digital data including the inverted second lower count value and the second upper count value is transmitted to the output unit 17 by the horizontal selection unit 14 through the horizontal signal line.

Figure 2:
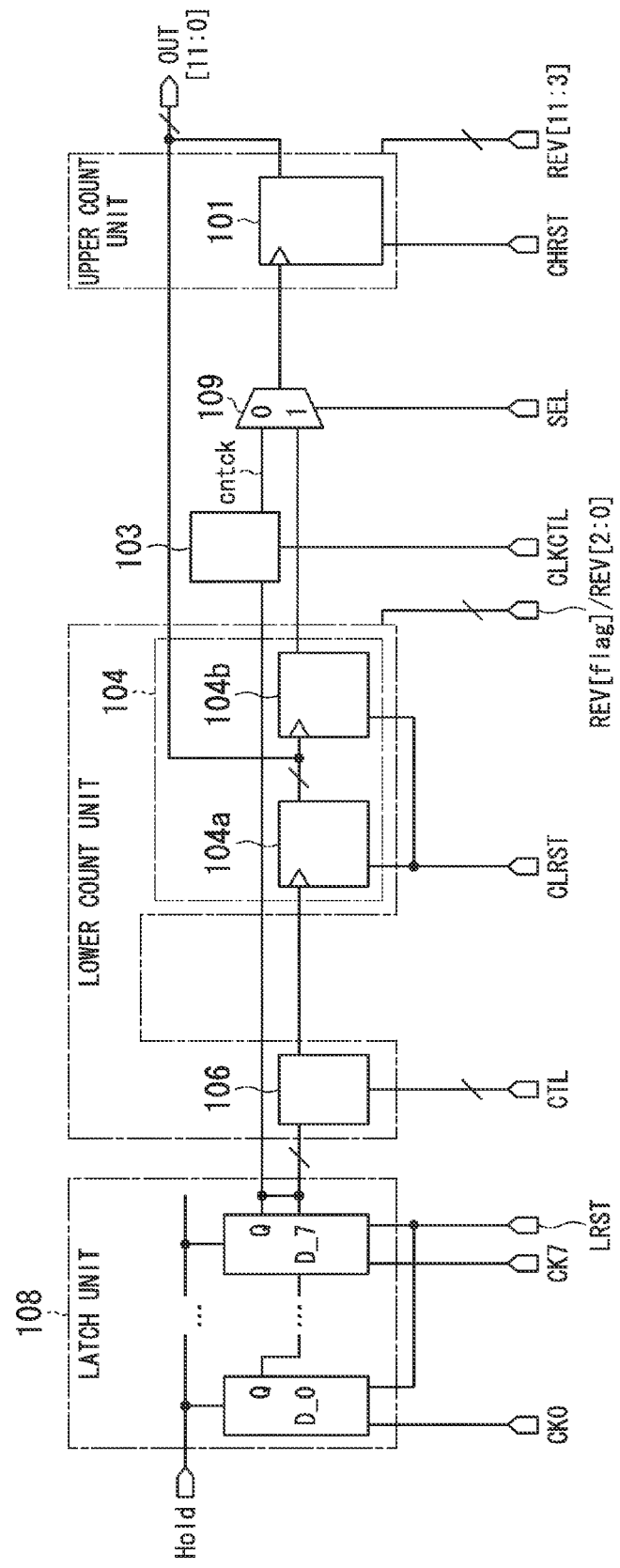
FIG. 2 is a block diagram illustrating a partial configuration of a column A/D conversion section in a first embodiment of the present invention.

Next, details of each configuration of the column A/D conversion section 16 will be described. FIG. 2 illustrates an example of a detailed configuration, from which the comparison units 110 are excluded and a unit of the elements of the column A/D conversion section 16 is extracted, in order to further describe the column A/D conversion section 16 of FIG. 1. Hereinafter, the configuration illustrated in FIG. 2 will be described. The configuration illustrated in FIG. 2 corresponds to the configuration of the column A/D conversion section 16 illustrated in FIG. 1, and is provided with the latch unit 108, the arithmetic unit 106, the lower counter 104, the modification unit 103, the switching unit 109, and the upper counter 101. The arithmetic unit 106 and the lower counter 104 constitute a lower count unit. The upper counter 101 constitutes an upper count unit. The ramp unit 19, the VCO100, and the comparison unit 110 of FIG. 1 and the configuration illustrated in FIG. 2 are an example of the A/D conversion circuit of the present invention.

The latch unit 108 includes latch circuits D_0 to D_7 configured to latch the logic states (lower phase signals) at a predetermined timing of the clock signals CK0 to CK7, which are output from the VCO100 including a delay unit, by a control signal Hold corresponding to the comparison output from the comparison unit 110. The logic states of the latch circuits D_0 to D_7 are reset by a control signal LRST. The lower phase signal latched by the latch unit 108 is output to the arithmetic unit 106. Furthermore, the clock signal CK7 input to the latch circuit D_7 of the latch unit 108 is output to the switching unit 109 through the modification unit 103 as a count clock to be used when the upper counter 101 performs counting. The arithmetic unit 106 generates a lower count signal based on the lower phase signal, which is output to the latch unit 108, by a control signal CTL. The lower counter 104 includes a binary counter circuit configured to perform counting in a down-count mode, and the upper counter 101 includes a binary counter circuit configured to perform counting in an up-count mode. The lower counter 104 includes the lower counter 104a and the lower counter 104b for a flag configured to determine the positive and negative. The switching unit 109 switches the count clock, which is input to the upper counter 101, by a control signal SEL.

Figure 8:
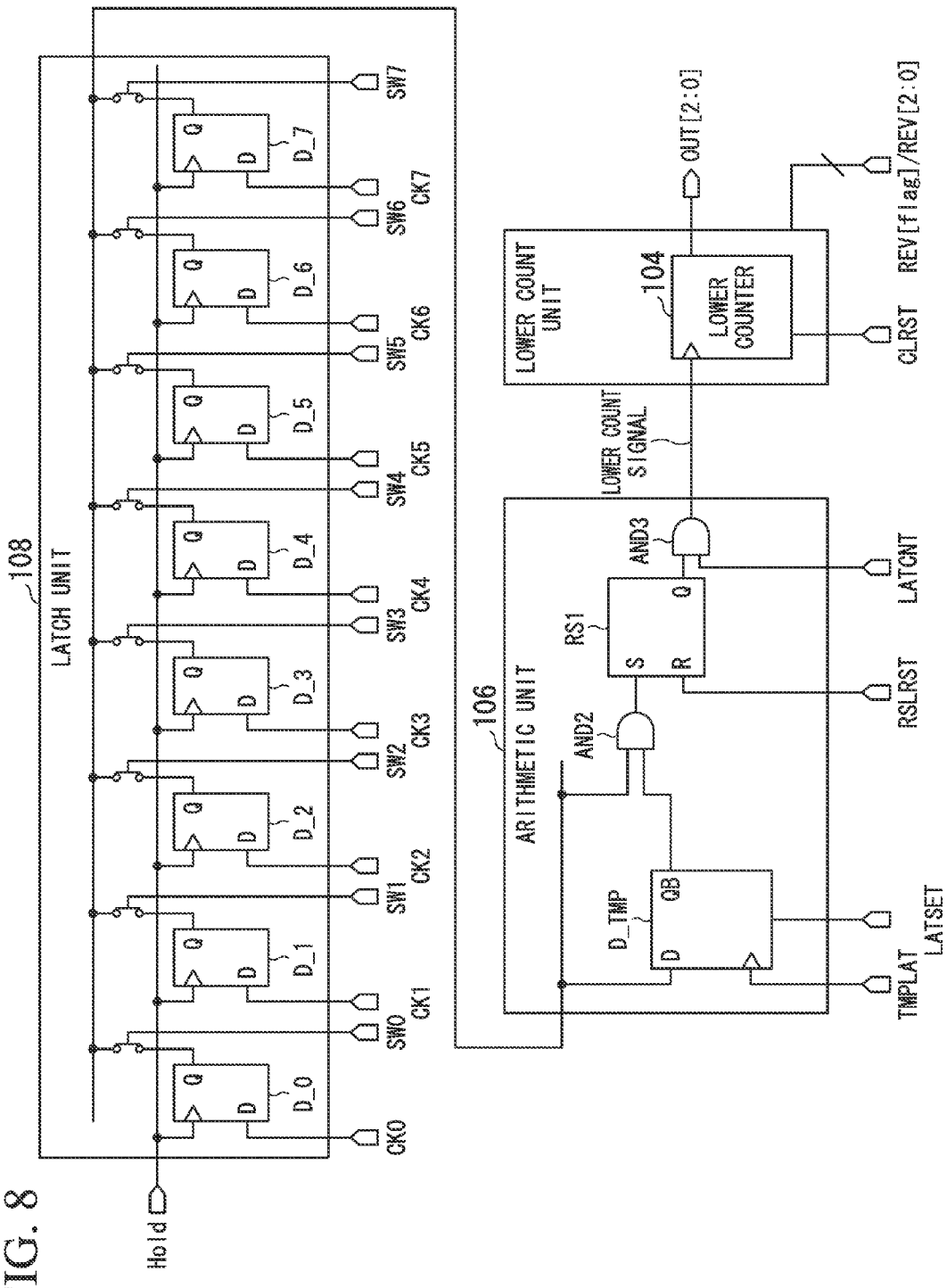
FIG. 8 is a block diagram illustrating an arithmetic circuit and a peripheral configuration thereof in a first embodiment of the present invention.

When the lower count signal is generated from the lower phase signal, for example, it may generate the lower count signal by a logic arithmetic operation of a pulse and a reference clock based on a thermo code using the configuration as illustrated in FIG. 8. However, the present invention is not limited to such a configuration. Details of FIG. 8 will be described in detail later.

Control signals CLRST/CHRST and a control signal REV[*] (*: 0 to 11, flag) are input to the lower counter 104 (104a and 104b) and the upper counter 101. The control signals CLRST/CHRST are used to reset the lower count value and the upper count value of the lower counter 104 (104a and 104b) and the upper counter 101. The control signal REV[*] (*: 0 to 12, flag) is used to toggle the lower count value and the upper count value of the lower counter 104 (104a and 104b) and the upper counter 101. The configurations of the lower counter 104 (104a and 104b) and the upper counter 101 will be described later with reference to FIG. 7.

The clock CK7 output through the latch circuit D_7 and a control signal CLKCTL are input to the modification unit 103. The modification unit 103 modifies the logic state of the input clock CK7 to a predetermined logic state (an H state in the present embodiment) in response to the control signal CLKCTL, and outputs a count clock cntck. The modification unit 103, for example, includes a logic circuit of a 2-input OR circuit and the like. However, the present invention is not limited thereto.

Next, the operation of the configuration illustrated in FIG. 2 will be described using a detailed example. As described above, for the purpose of convenience, a description will be provided for a case in which the count mode of the upper counter 101 is the up-count mode, the count mode of the lower counter 104 is the down-count mode, and the upper counter 101 and the lower counter 104 perform the counting at the falling edge timing of a count clock. In the present embodiment, a description will be provided for a case in which a down-counter circuit of the total four bits is used as the lower counter 104 (104a and 104b) and an up-counter circuit of nine bits is used as the upper counter 101. The number of states of the lower phase signal based on eight clock signals, which are an output of the delay circuit, is 8 (states 0 to 7). When the counting is performed in the down-count mode, for example, in the case of the state 0, a count value is 3'b[0]000, and in the case of the state 7, a count value is 3'b[1]001.

Expression of the count values will be described. "3'b" indicates a binary with a count value of 3 bits. The output of the lower counter 104a and 104b, for example, is expressed as "[0]000". "[0]" indicates the output of the lower counter 104b and "000" indicates the output of the lower counter 104a. A similar expression is used for the count value of the upper counter 101.

Hereinafter, an example in which subtraction (a CDS process) of a first pixel signal and a second pixel signal subsequent to the first pixel signal is performed will be described. In the present embodiment, binary subtraction using a complement of 2 is performed. When a digital value obtained by AD-converting the first pixel signal is set as A and a digital value obtained by AD-converting the second pixel signal is set as B, a subtraction result to be obtained is B−A. In the present embodiment, the lower counter 104 (104a and 104b) and the upper counter 101 separately perform the counting, resulting in the achievement of digital data including the lower count value as a counting result of the lower counter 104 (104a and 104b) and the upper count value as a counting result of the upper counter 101.

In the present embodiment, since the lower counter 104 (104a and 104b) performs the counting in the down-count mode, the lower counter 104 (104a and 104b) performs the counting based on the first pixel signal at the time of first reading and further a lower count value after performing inversion corresponds to a lower bit of the digital value A. However, since the complement of 2 is used, it may add 1 to the lower count value. Subsequently, the lower counter 104 (104a and 104b) performs the counting based on the second pixel signal at the time of second reading and further a lower count value after performing inversion corresponds to a lower bit of the digital value B−A. However, since the complement of 2 is used, it may add 1 to the lower count value. Since a change in the value by the addition of 1 required after the inversion at the time of the first reading and a change in the value by the addition of 1 required after the inversion at the time of the second reading is offset from each other, the addition of 1 is not performed after the inversion.

Meanwhile, in the present embodiment, since the upper counter 101 performs the counting in the up-count mode, the upper counter 101 performs the counting based on the first pixel signal at the time of the first reading and further an upper count value after performing inversion corresponds to an upper bit of the digital value −A. However, since the complement of 2 is used, it may add 1 to the upper count value. Subsequently, the upper counter 101 performs the counting based on the second pixel signal at the time of the second reading corresponds to an upper bit of the digital value B−A. However, the addition of 1 required after the inversion at the time of the first reading and the adjustment of the upper count value based on the digit-up and the digit-down of the lower cont value are necessary. In the present embodiment, at the time of the switching of the count clock, the switching of the count clock, the adjustment of the upper count value based on the digit-up and digit-down of the lower count value, and the adjustment of the upper count value based on the binary subtraction using the complement of 2 are all performed.

Figure 4:
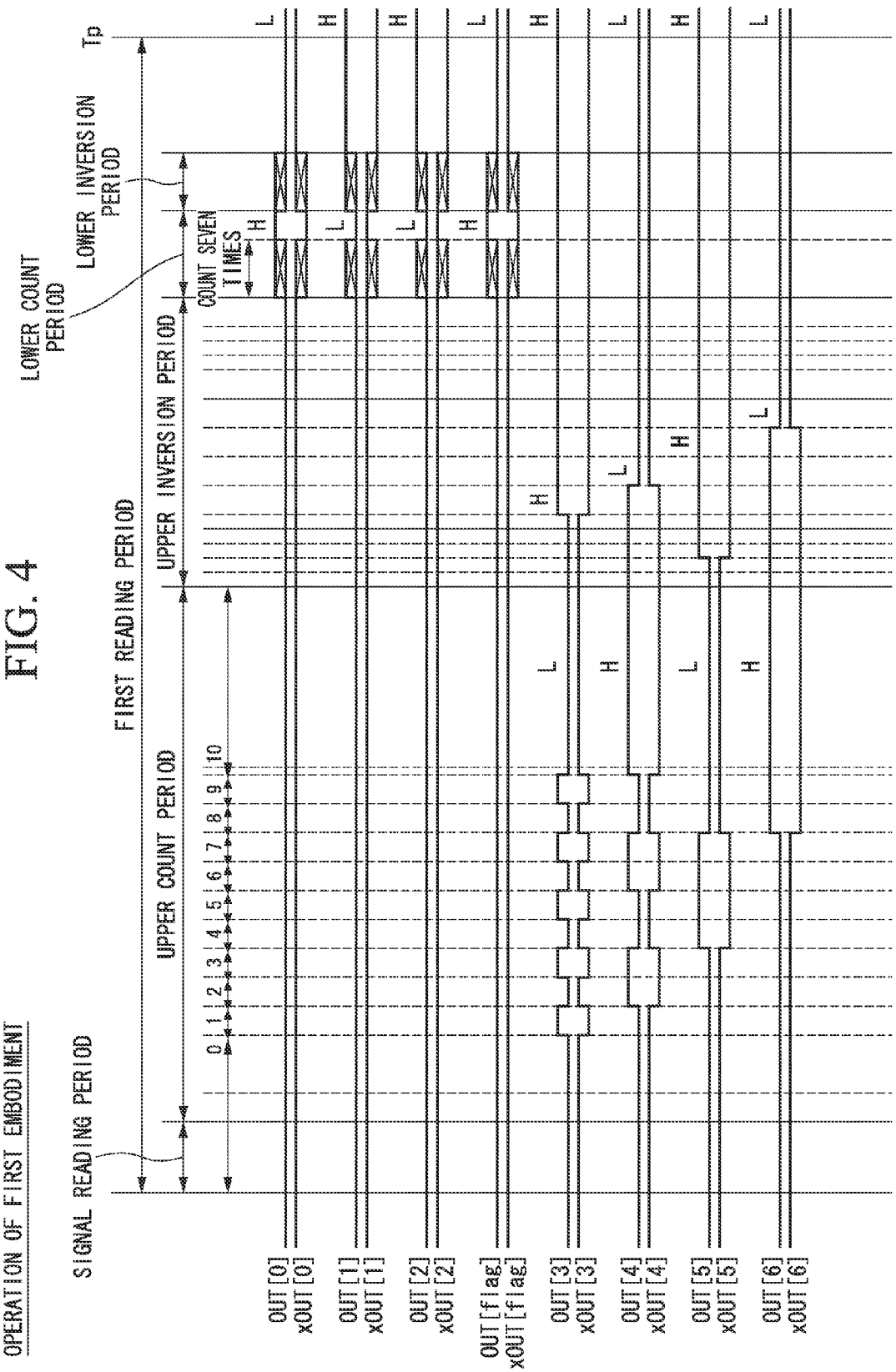
FIG. 4 is a timing chart illustrating an operation at the time of subtraction in a first embodiment of the present invention.
Figure 5:
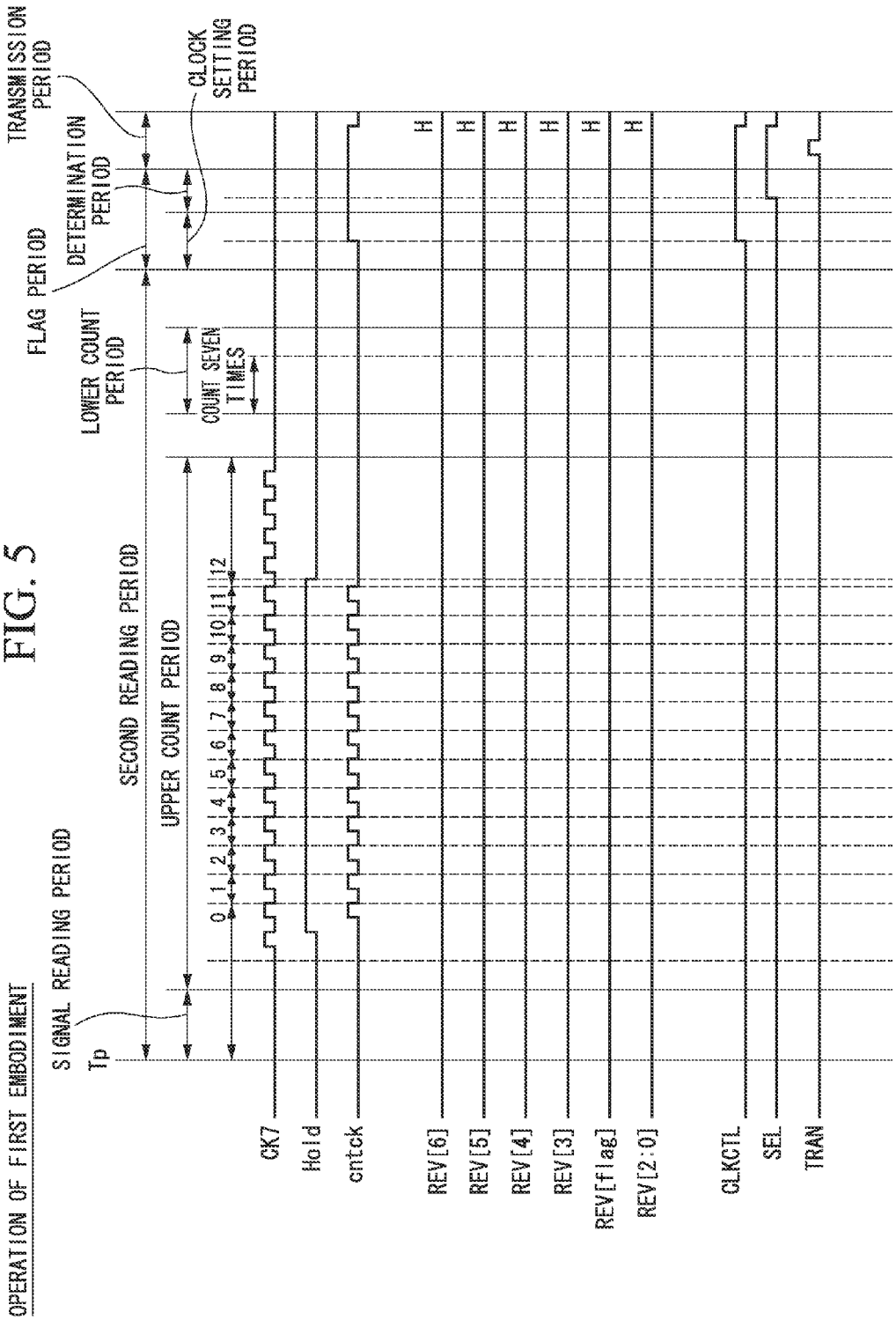
FIG. 5 is a timing chart illustrating an operation at the time of subtraction in a first embodiment of the present invention.
Figure 6:
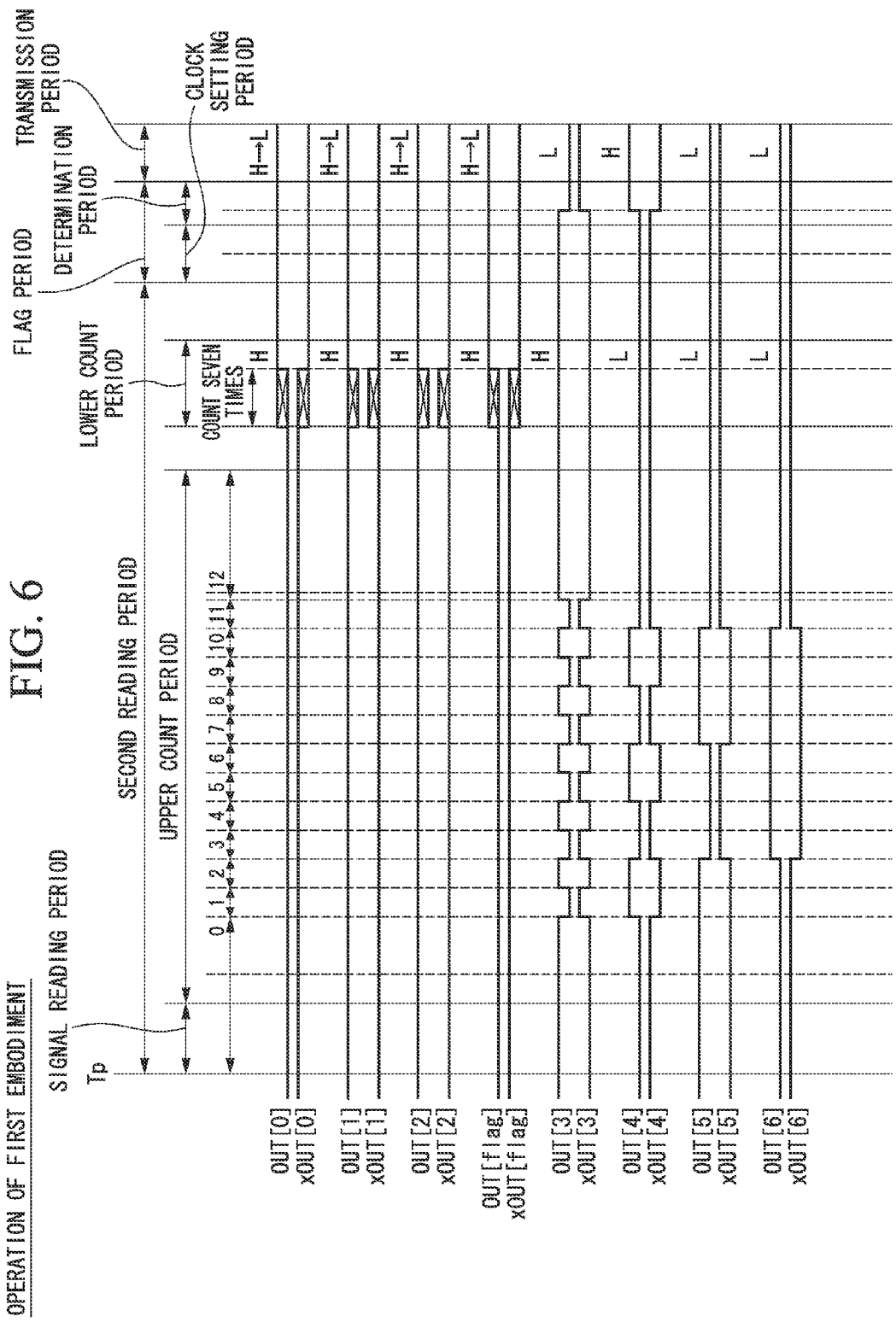
FIG. 6 is a timing chart illustrating an operation at the time of subtraction in a first embodiment of the present invention.

FIG. 3 to FIG. 6 illustrate waveforms of signals according to the operations of the present embodiment. FIG. 3 and FIG. 4 illustrate waveforms of signals at the time of the first reading, and FIG. 5 and FIG. 6 illustrate waveforms of signals at the time of the second reading. In FIG. 4 and FIG. 6, OUT[0], OUT[1], and OUT[2] indicate the output of the lower counter 104a, and xOUT[0], xOUT[1], and xOUT[2] indicate the inverted output of the lower counter 104a. OUT[flag] indicates the output of the lower counter 104b, and xOUT[flag] indicates the inverted output of the lower counter 104b. OUT[3], OUT[4], OUT[5], and OUT[6] indicate a unit of the output of the upper counter 101, and xOUT[3], xOUT[4], xOUT[5], and xOUT[6] indicate a unit of the inverted output of the upper counter 101a. TRAN indicates a control signal that transmits digital data to the output unit 17.

The operations of the present embodiment are performed in a first reading period in which the first pixel signal is read and AD-converted, a second reading period in which the second pixel signal is read and AD-converted, a flag period in which the count clock of the upper counter 101 is switched, and a transmission period in which the digital data is transmitted. The first reading period includes a signal reading period in which the first pixel signal is read, an upper count period in which the upper counter 101 performs the counting, an upper inversion period in which the upper count value of the upper counter 101 is inverted, a lower count period in which the lower counter 104 (104a and 104b) performs the counting, and a lower inversion period in which the lower count value of the lower counter 104 (104a and 104b) is inverted.

The second reading period includes a signal reading period in which the second pixel signal is read, an upper count period in which the upper counter 101 performs the counting, and a lower count period in which the lower counter 104 (104a and 104b) performs the counting. Furthermore, the flag period includes a clock setting period in which the modification unit 103 modifies the logic state of the count clock of the upper counter 101, and a determination period in which the switching of the count clock of the upper counter 101, the adjustment of the upper count value based on the digit-up and digit-down of the lower count value, and the adjustment of the upper count value based on the binary subtraction using the complement of 2 are performed.

Here, it is assumed that a state corresponding to the lower phase signal of the first pixel signal is the state 7, an upper count value based on the first pixel signal is 10, a state corresponding to the lower phase signal of the second pixel signal is the state 7, and an upper count value based on the second pixel signal is 12. That is, the first pixel signal corresponds to 87 (=7+8 10), the second pixel signal corresponds to 103 (=7+8 12), and a value obtained by subtracting (a CDS process) the first pixel signal from the second pixel signal is 16.

<<First Reading>>

Initially, the logic states of the latch circuits D_0 to D_7 are reset by a control signal LRST. Furthermore, the count values of the lower counters 104a and 104b are reset by a control signal CLRST. Simultaneously, the count value of the upper counter 101 is reset by a control signal CHRST. Since a control signal SEL has been set to an L state, the count clock of the upper counter 101 is set as the output of the latch circuit D_7 of the latch unit 108. Accordingly, until a comparison process is completed, the clock signal CK7 is input to the upper counter 101 through the latch circuit D_7 and the switching unit 109, and the upper counter 101 performs counting using the clock signal CK7 as a count clock. At the start time point of the comparison process in the upper count period subsequent to the signal reading period, values held by the lower counters 104a and 104b are 3'b[0]000 and a value held by the upper counter 101 is 9'b0000_0000_0. If these values are expressed in 12 bits, 12'b0000_0000_0000 is obtained.

In the upper count period, at a first timing (the first timing according to the comparison of the ramp wave applied from the ramp unit 19 and the reset level in the above-mentioned operation) satisfying predetermined conditions, the control signal Hold is inverted, and the states of the clock signals CK0 to CK7, which are the logic state of the VCO100 at that time, are held (the first lower phase signal). Simultaneously, the upper counter 101 stops the count operation. At this time, values held by the lower counters 104a and 104b are 3'b[0]

000 and a value held by the upper counter 101 is 9'b0000_0101_0 (corresponding to 10). If these values are expressed in 12 bits, 12'b0000_0101_0000 is obtained.

Subsequently, in the upper inversion period, the count value of the upper counter 101 is inverted. At this time, values held by the lower counters 104a and 104b are 3'b[0]000 and a value held by the upper counter 101 is 9'b1111_1010_1 (corresponding to −11). If these values are expressed in 12 bits, 12'b1111_1010_1000 is obtained. In the present embodiment, the value is inverted, and then 1 is not added.

Subsequently, in the lower count period, a binarization process of the first lower phase signal is performed. Through the binarization process of the first lower phase signal, a count clock is output from the arithmetic unit 106 to the lower counter 104a, so that the lower counter 104a performs counting. In the present embodiment, the inverted output of the third bit of the lower counter 104a is input to the lower counter 104b. At the timing at which the output of the third bit of the lower counter 104a changes from "0" to "1," the inverted output of the third bit of the lower counter 104a changes from "1" to "0," so that digit-down occurs in the count value of the lower counter 104a. By the digit-down, 1 is subtracted from the count value of the lower counter 104b. At the completion time point of the binarization process of the first lower phase signal, values held by the lower counters 104a and 104b are 3'b[1]001 (corresponding to −7) and a value held by the upper counter 101 is 9'b1111_1010_1 (corresponding to −11). If these values are expressed in 12 bits, 12'b1111_1010_1001 is obtained.

Subsequently, in the lower inversion period, the count values of the lower counters 104a and 104b are inverted. At this time, values held by the lower counters 104a and 104b are 3'b[0]110 (corresponding to 6) and a value held by the upper counter 101 is 9'b1111_1010_1 (corresponding to −11). If these values are expressed in 12 bits, 12'b1111_1010_1110 is obtained. In the present embodiment, the value is inverted, and then 1 is not added.

<<Second Reading>>

First, the latch circuits D_0 to D_7 are reset by the control signal LRST. Here, the count values of the lower counters 104a and 104b are not reset by the control signal CLRST and the count value of the upper counter 101 is not reset by the control signal CHRST. At this time, values held by the lower counters 104a and 104b are 3'b[0]110 (corresponding to 6) and a value held by the upper counter 101 is 9'b1111_1010_1 (corresponding to −11). If these values are expressed in 12 bits, 12'b1111_1010_1110 is obtained.

In the upper count period subsequent to the signal reading period, at a second timing (the second timing according to the comparison of the ramp wave applied from the ramp unit 19 and the signal level in the above-mentioned operation) satisfying predetermined conditions, the control signal Hold is inverted, and the states of the clock signals CK0 to CK7, which are the logic state of the VCO100 at that time, are held (the second lower phase signal). Simultaneously, the upper counter 101 stops the count operation. At this time, values held by the lower counters 104a and 104b are 3'b[0]110 (corresponding to 6) and a value held by the upper counter 101 is 9'b0000_0000_1 (corresponding to 1). If these values are expressed in 12 bits, 12'b0000_0000_1110 is obtained.

Subsequently, in the lower count period, a binarization process of the second lower phase signal is performed. Through the binarization process of the second lower phase signal, a count clock is output from the arithmetic unit 106 to the lower counter 104a, so that the lower counter 104a performs counting. In the present embodiment, the inverted output of the third bit of the lower counter 104a is input to the lower counter 104b. At the timing at which the output of the third bit of the lower counter 104a changes from "0" to "1," the inverted output of the third bit of the lower counter 104a changes from "1" to "0," so that digit-down occurs in the count value of the lower counter 104a. By the digit-down, 1 is subtracted from the count value of the lower counter 104b. At the completion time point of the binarization process of the second lower phase signal, values held by the lower counters 104a and 104b are 3'b[1]111 (corresponding to −1) and a value held by the upper counter 101 is 9'b0000_0000_1 (corresponding to 1). If these values are expressed in 12 bits, 12'b0000_0000_1111 is obtained.

Subsequently, in the flag period, the count clock input to the upper counter 101 is switched. In the present embodiment, the second count clock, which is a count clock after the switching, is the inverted output of the lower counter 104b. Here, as the second count clock, an L state is output when the digit-up or digit-down occurs in the lower count value and an H state is output when no shift-up or shift-down occurs in the lower count value.

First, in the clock setting period in the flag period, the control signal CLKCTL enters an H state from an L state, so that a count clock before the switching enters an H state (the output of the modification unit 103 is in an H state).

Subsequently, in the determination period in the flag period, the control signal SEL is set as an H state, and a count clock is switched. The inverted output of the lower counter 104b, which is the count clock after the switching, is in an L state, and 1 is added to the count value of the upper counter 101. At this time, values held by the lower counters 104a and 104b are 3'b[1]111 (corresponding to −1) and a value held by the upper counter 101 is 9'b0000_0001_0 (corresponding to 2). If these values are expressed in 12 bits, 12'b0000_0001_0111 is obtained.

Subsequently, only the count values of the lower counters 104a and 104b are inverted (omitted in FIG. 3 to FIG. 6). At this time, values held by the lower counters 104a and 104b are 3'b[0]000 (corresponding to 0) and a value held by the upper counter 101 is 9'b0000_0001_0 (corresponding to 2). If these values are expressed in 12 bits, 12'b0000_0001_0000 (corresponding to 16) is obtained. In the binary subtraction, a value is inverted and then 1 should be added. However, as described above, since a value is also inverted at the time of the first reading, 1 is added after each inversion, so that a change in a value is offset. Accordingly, in the present embodiment, in relation to the lower count value, a value is inverted and then 1 is not added. Furthermore, in relation to the upper count value, adjustment according to addition of 1 after the value is inverted is performed together with adjustment based on the shift-up and shift-down of the lower count value at the time of the switching of the count clock.

In the transmission period, digital data including the second lower count value and the second upper count value is transmitted to the output unit 17 by the horizontal selection unit 14 through the horizontal signal line. Through the above operation, binary data corresponding to the difference between the first pixel signal and the second pixel signal is obtained.

Figure 7:
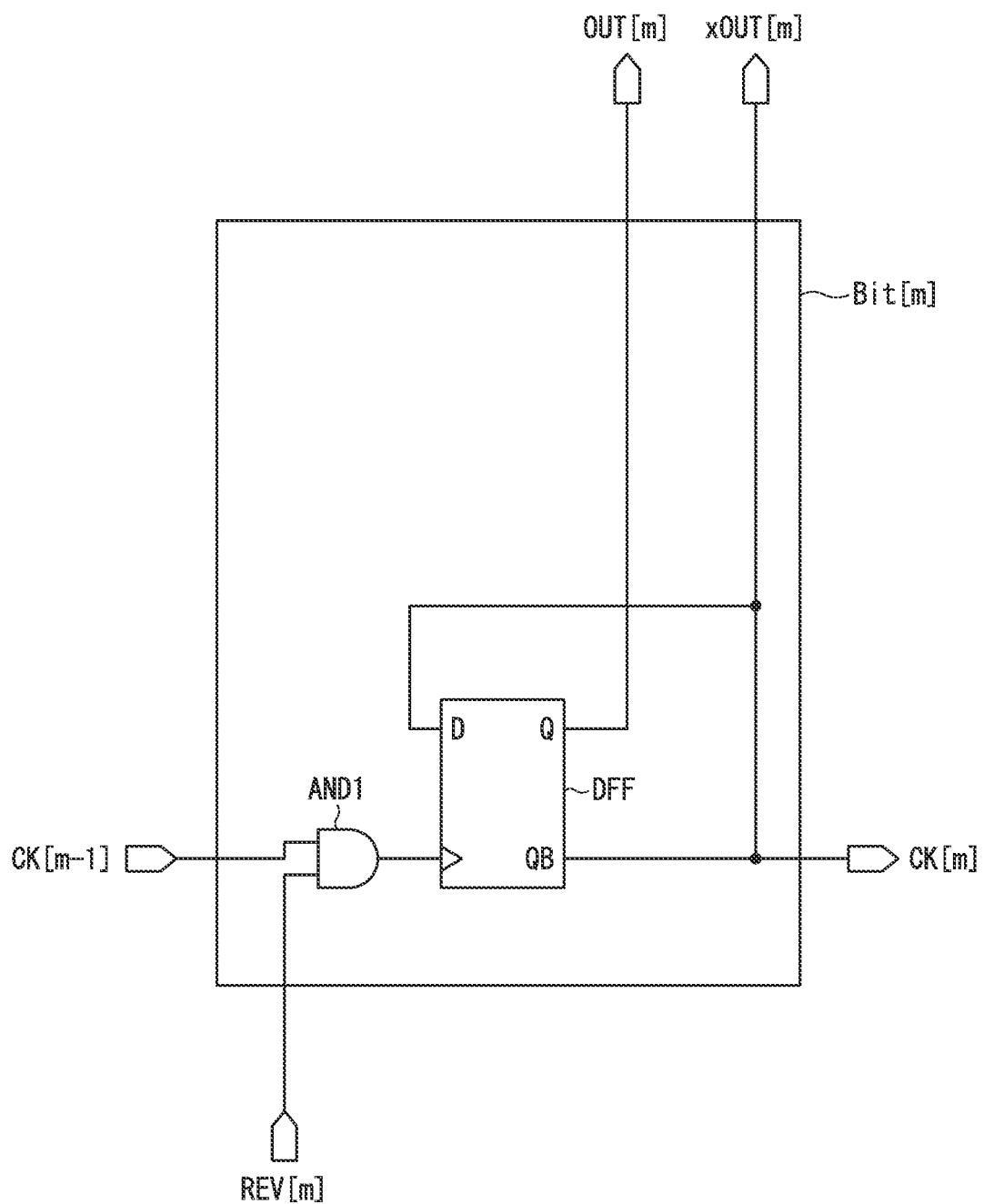
FIG. 7 is a circuit diagram illustrating a configuration of a binary counter circuit in a first embodiment of the present invention.

Next, details of the binary counter circuit used in the lower counter 104 (104a and 104b) and the upper counter 101 will be described. FIG. 7 illustrates an example of the configuration of a counter circuit Bit[m] (m: 0 to n−1) corresponding to one bit, which constitutes the lower counter 104 (104a and 104b) and the upper counter 101. The counter circuit Bit[m] illustrated in FIG. 7 includes a flip-flop circuit DFF and an AND circuit AND1. When n counter circuits are connected to one another, a counter circuit of n bits is configured.

The flip-flop circuit DFF includes a D flip-flop. The AND circuit AND1 performs an AND operation on a count clock CK[m−1] and a control signal REV[*] (*: 0 to 11, flag), thereby validating or invalidating a count clock. When the count mode is the up-count mode, the output Q of the counter circuit Bit[m] is output to a subsequent counter circuit. When the count mode is the down-count mode, the inverted output QB of the counter circuit Bit[m] is output to the subsequent counter circuit.

When the counter circuit Bit[m] performs counting (refer to the upper count period and the lower count period of FIG. 3 to FIG. 6), the control signal REV[*] enters an H state, so that the count clock CK[m−1] is validated, and the output Q and the inverted output QB of the flip-flop circuit DFF are changed according to a change in the count clock CK[m−1]. Furthermore, an inversion operation of the counter circuit Bit[m] is performed as follows (refer to the upper inversion period of FIG. 3 to FIG. 6). After a count operation, when the output of the AND circuit AND1 is held in an L state or an H state or when the output of the AND circuit AND1 is changed from the L state to the H state, the output Q and the inverted output QB of the flip-flop circuit DFF are held in a constant state without change. Furthermore, by a change of the control signal REV[*] from the H state to the L state, when the output of the AND circuit AND1 is changed from the H state to the L state, the output Q and the inverted output QB of the flip-flop circuit DFF are inverted.

Next, details of the arithmetic unit 106 will be described. FIG. 8 illustrates an example of a detailed configuration including a peripheral configuration of the arithmetic unit 106 in order to describe the generation of the lower count signal in the arithmetic unit 106. In the configuration illustrated in FIG. 8, the latch unit 108 and the lower counter 104 have been described above. Hereinafter, the configuration of the arithmetic unit 106 will be described.

As illustrated in FIG. 8, the arithmetic unit 106 includes a latch circuit D_TMP, an AND circuit AND2, an RS latch RS1, and an AND circuit AND3. The latch circuit D_TMP temporarily holds the output of the latch circuits D_0 to D_7 in a predetermined order according to a pulse signal TMPLAT. Furthermore, the latch circuit D_TMP is reset by a control signal LATSET. The AND circuit AND2 performs an AND operation on the output of any one of the latch circuits D_0 to D_7 and the inverted output QB of the latch circuit D_TMP.

The RS latch RS1 is input the output of the AND circuit AND2 and a control signal RSLRST. After the RS latch RS1 is reset by the control signal RSLRST, the output Q of the RS latch RS1 changes from an L state to an H state when the output of the AND circuit AND2 changes from an L state to an H state, and is held in the H state, regardless of the output of the AND circuit AND2, until the AND circuit AND2 is reset by the control signal RSLRST. The AND circuit AND3 performs an AND operation on the output of the RS latch RS1 and a count signal LATCNT (a reference clock).

Figure 9:
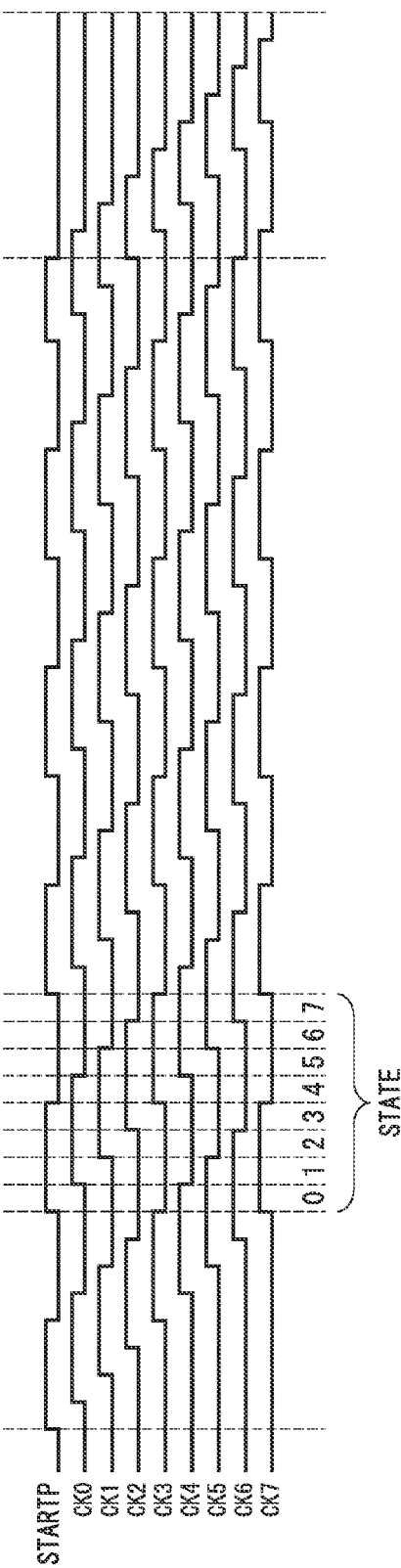
FIG. 9 is a timing chart illustrating an operation at the time of generation of a lower count signal in a first embodiment of the present invention.
Figure 10:
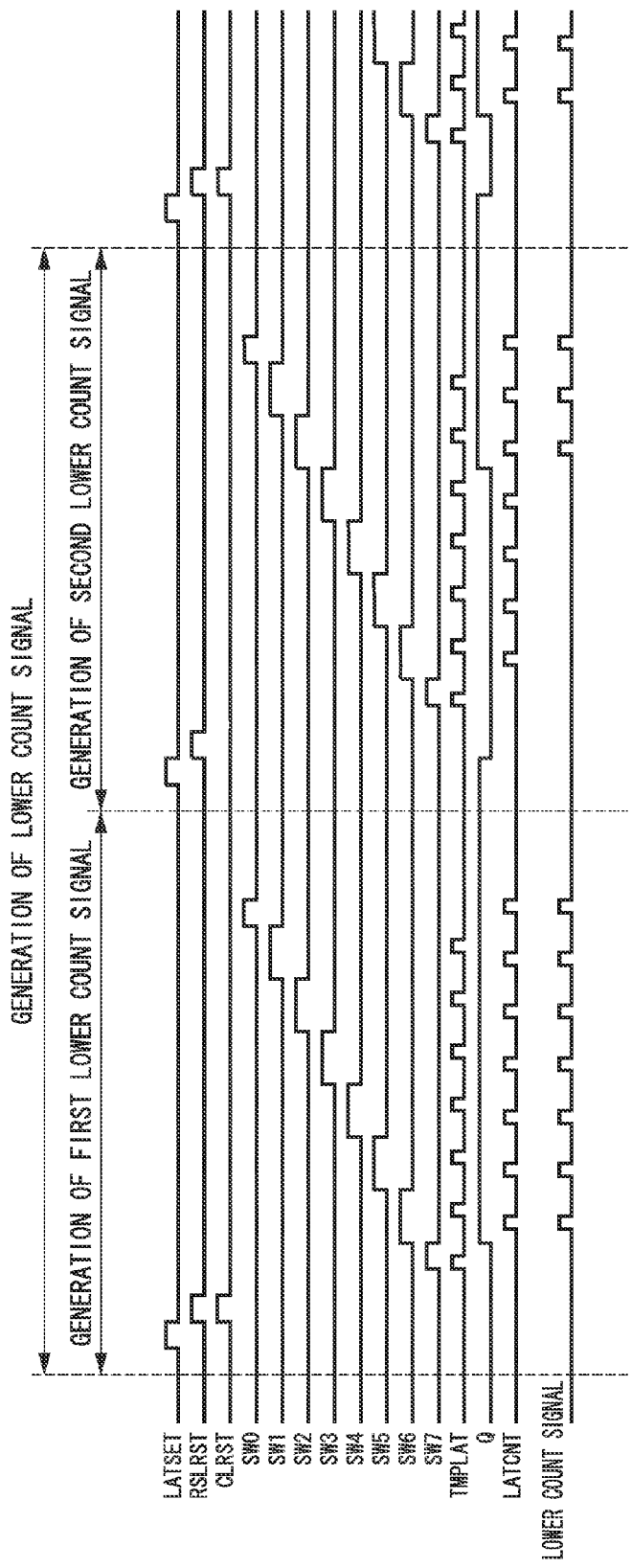
FIG. 10 is a timing chart illustrating an operation at the time of generation of a lower count signal in a first embodiment of the present invention.

Next, the operation of the arithmetic unit 106 will be described. FIG. 9 and FIG. 10 illustrate the operation at the time of the generation of the lower count signal. FIG. 9 illustrates the waveforms of the clock signals CK0 to CK7 output from the delay circuit. In FIG. 9, a pulse signal STARTP is a pulse signal input to the delay circuit. The states of the clock signals CK0 to CK7 correspond to any one of the state 0 to the state 7 illustrated in FIG. 9. The latch circuits D_0 to D_7 of the latch unit 108 latch the states (the lower phase signal) of the clock signals CK0 to CK7 by the control signal Hold. FIG. 10 illustrates waveforms of signals according to an operation for generating the lower count signal.

Hereinafter, a detailed example in which the first lower count signal is generated from the first lower phase signal and the second lower count signal is generated from the second lower phase signal will be described. Here, it is assumed that a state corresponding to the first lower phase signal is the state 7 and a state corresponding to the second lower phase signal is the state 3. In the present embodiment, the first lower count signal with seven pulses is generated from the first lower phase signal and the second lower count signal with three pulses is generated from the second lower phase signal. Each generated pulse is input as a count clock of the lower counter 104.

First, a schematic operation will be described. By control signals SW0 to SW7 and the pulse signal TMPLAT, pulses corresponding to the lower phase signal are generated, and a thermo code (an edge position changing from an H state to an L state in the case of the present example) is detected based on the pulses. When a result of an AND operation on the output Q of the latch circuit D_* (* is any one of 0 to 7) and the inverted output QB of the latch circuit D_TMP has entered an H state, the H state is input to the RS latch RS1, resulting in the detection of the thermo code. Furthermore, the pulses of the lower count signal are generated as a result of an AND operation on the output of the RS latch RS1 and the count signal LATCNT, and serve as the count clock of the lower counter 104.

Hereinafter, a detailed operation will be described. Since the detailed operation of the lower counter 104 has already been described, the operation of the lower counter 104 will not be described. At a first time point (corresponding to the first timing according to the comparison of the ramp wave applied from the ramp unit 19 and the reset level in the above-mentioned operation) satisfying predetermined conditions, the control signal Hold changes, so that the states of the clock signals CK0 to CK7 output from the delay circuit are held by the latch unit 108. At this time, the states held in the latch circuits D0 to D_7 correspond to the first lower phase signal.

Subsequently, the latch circuit D_TMP is reset by the control signal LATSET, the count value of the lower counter 104 is reset by the control signal CLRST, and the RS latch RS1 is reset by the control signal RSLRST. The output Q of the RS latch RS1 at this time is in an L state.

Next, the control signals SW* (*: 0 to 7) are turned on in a predetermined order. If the control signal SW7 is turned on, a signal in an L state is output from the latch circuit D_7. By the pulse signal TMPLAT, the inverted output QB of the latch circuit D_TMP enters an L state when the latch circuit D_TMP has been reset by the control signal LATSET. By the output in the L state of the latch circuit D_TMP and the output in the L state of the latch circuit D_7, the output of the AND circuit AND2 enters an L state. Since the input S of the RS latch RS1 enters an L state, the output Q of the RS latch RS1 maintains the L state.

Next, if the control signal SW6 is turned on, a signal in an H state is output from the latch circuit D_6. By the pulse signal TMPLAT, the inverted output QB of the latch circuit D_TMP enters an H state based on the output (L) of the latch circuit D_7. By the output in the H state of the latch circuit D_TMP and the output in the H state of the latch circuit D_6, the output of the AND circuit AND2 enters an H state. Since the input S of the RS latch RS1 enters an H state, the output Q of the RS latch RS1 enters an H state. By the output Q of the RS latch RS1 and the count signal LATCNT, a count clock of one pulse is output from the AND circuit AND3.

Next, if the control signal SW5 is turned on, a signal in an H state is output from the latch circuit D_5. By the pulse signal TMPLAT, the inverted output QB of the latch circuit D_TMP enters an L state based on the output (H) of the latch circuit D_6. By the output in the L state of the latch circuit D_TMP and the output in the H state of the latch circuit D_6, the output of the AND circuit AND2 enters an L state. Since the input S of the RS latch RS1 enters an L state, but the control signal RSLRST input to the RS latch RS1 is in an L state, the output Q of the RS latch RS1 maintains the H state. By the output Q of the RS latch RS1 and the count signal LATCNT, a count clock of one pulse is output from the AND circuit AND3.

Then, the control signals SW4 to SW0 are sequentially turned on. However, since the input S of the RS latch RS1 maintains the L state, the output Q of the RS latch RS1 maintains the H state. Thus, when the control signals SW4 to SW0 have been sequentially turned on, a pulse of a count clock is output from the AND circuit AND3 by the output Q of the RS latch RS1 and the count signal LATCNT. Accordingly, the first lower count signal with 7 pulses in total serving as the count clock of the lower counter 104 is generated. In this way, the generation of the first lower count signal is completed.

Subsequently, At a second time point (corresponding to the second timing according to the comparison of the ramp wave applied from the ramp unit 19 and the signal level in the above-mentioned operation) satisfying predetermined conditions, the control signal Hold changes, so that the states of the clock signals CK0 to CK7 output from the delay circuit are held by the latch unit 108. At this time, the states held in the latch circuits D_0 to D_7 correspond to the second lower phase signal.

Subsequently, the latch circuit D_TMP is reset by the control signal LATSET and the RS latch RS1 is reset by the control signal RSLRST. Here, the lower counter 104 is not reset. The output Q of the RS latch RS1 at this time is in an L state.

Subsequently, the control signals SW* (*: 0 to 7) are turned on in a predetermined order. If the control signal SW7 is turned on, a signal in an H state is output from the latch circuit D_7. By the pulse signal TMPLAT, the inverted output QB of the latch circuit D_TMP enters an L state when the latch circuit D_TMP has been reset by the control signal LATSET. By the output in the L state of the latch circuit D_TMP and the output in the H state of the latch circuit D_7, the output of the AND circuit AND2 enters an L state. Since the input S of the RS latch RS1 enters an L state, the output Q of the RS latch RS1 maintains the L state.

Subsequently, if the control signal SW6 is turned on, a signal in an L state is output from the latch circuit D_6. By the pulse signal TMPLAT, the inverted output QB of the latch circuit D_TMP enters an L state based on the output (H) of the latch circuit D_7. By the output in the L state of the latch circuit D_TMP and the output in the L state of the latch circuit D_6, the output of the AND circuit AND2 enters an L state. Since the input S of the RS latch RS1 maintains the L state, the output Q of the RS latch RS1 maintains the L state. By the output Q of the RS latch RS1 and the count signal LATCNT, a pulse of a count clock is not output from the AND circuit AND3.

Then, the control signals SW5 to SW3 are sequentially turned on. However, since the input S of the RS latch RS1 maintains the L state, the output Q of the RS latch RS1 maintains the L state. Thus, when the control signals SW5 to SW3 have been sequentially turned on, a pulse of a count clock is not output from the AND circuit AND3 by the output Q of the RS latch RS1 and the count signal LATCNT.

Subsequently, if the control signal SW2 is turned on, a signal in an H state is output from the latch circuit D_2. By the pulse signal TMPLAT, the inverted output QB of the latch circuit D_TMP enters an H state based on the output (L) of the latch circuit D_3. By the output in the H state of the latch circuit D_TMP and the output in the H state of the latch circuit D_2, the output of the AND circuit AND2 enters an H state. Since the input S of the RS latch RS1 enters an H state, the output Q of the RS latch RS1 enters an H state. By the output Q of the RS latch RS1 and the count signal LATCNT, a pulse of a count clock is output from the AND circuit AND3.

Then, the control signals SW1 and SW0 are sequentially turned on. However, since the input S of the RS latch RS1 maintains the L state, the output Q of the RS latch RS1 maintains the H state. Thus, when the control signals SW1 and SW0 have been sequentially turned on, a pulse of a count clock is output from the AND circuit AND3 by the output Q of the RS latch RS1 and the count signal LATCNT. Accordingly, the second lower count signal with 3 pulses in total serving as the count clock of the lower counter 104 is generated. In this way, the generation of the second lower count signal is completed. With the configuration illustrated in FIG. 8, the circuit for generating the lower count signal from the lower phase signal can be realized using a simple circuit configuration.

As described above, according to the present embodiment, the modification unit 103 modifies the logic state of the count clock to a predetermined state at the time of the switching of the count clock, so that it is possible to prevent an error of the count value depending on the logic state of the count clock before the switching. Furthermore, since it is sufficient if the lower counters 104a and 104b and the upper counter 101 have only one type of count mode (the lower counters 104a and 104b have the down-count mode and the upper counter 101 has the up-count mode in the present embodiment), it is possible to realize the A/D conversion circuit using a simple circuit configuration.

Furthermore, the ring-like delay circuit, in which a plurality of delay elements are connected to one another in a ring shape, is used as a delay circuit, resulting in the improvement of accuracy of each phase of the lower phase signal. Furthermore, the A/D conversion circuit of the present embodiment is applied to an imaging device, resulting in the achievement of a high quality image.

Second Embodiment

Figure 11:
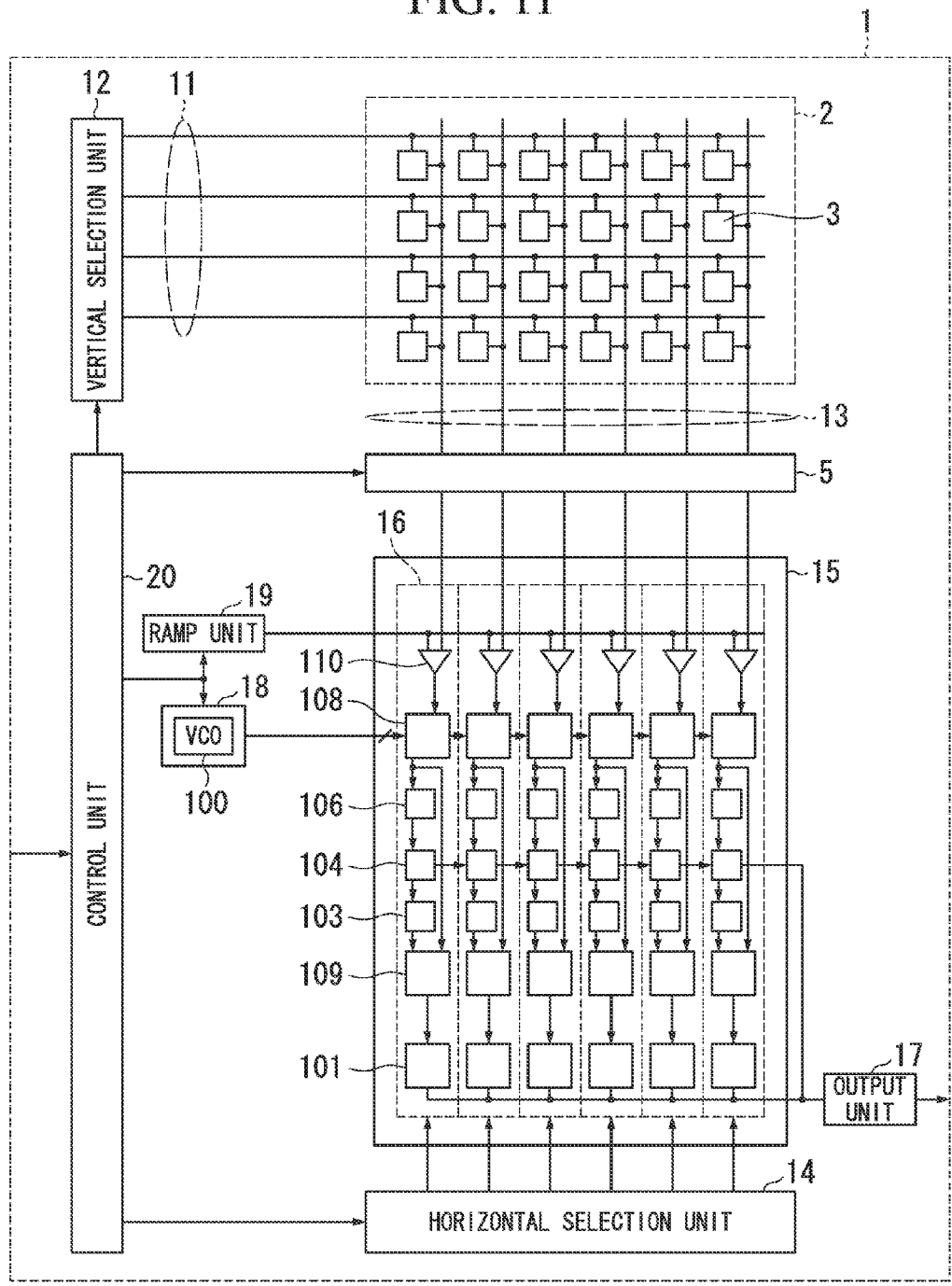
FIG. 11 is a block diagram illustrating a configuration of an imaging device according to a second embodiment of the present invention.

Next, a second embodiment of the present invention will be described. FIG. 11 illustrates an example of the configuration of a (C)MOS imaging device according to the present embodiment. Since the configuration of the imaging device according to the present embodiment is the same as the configuration illustrated in FIG. 1, except for the column A/D conversion section 16, a redundant description will not be repeated.

Figure 12:
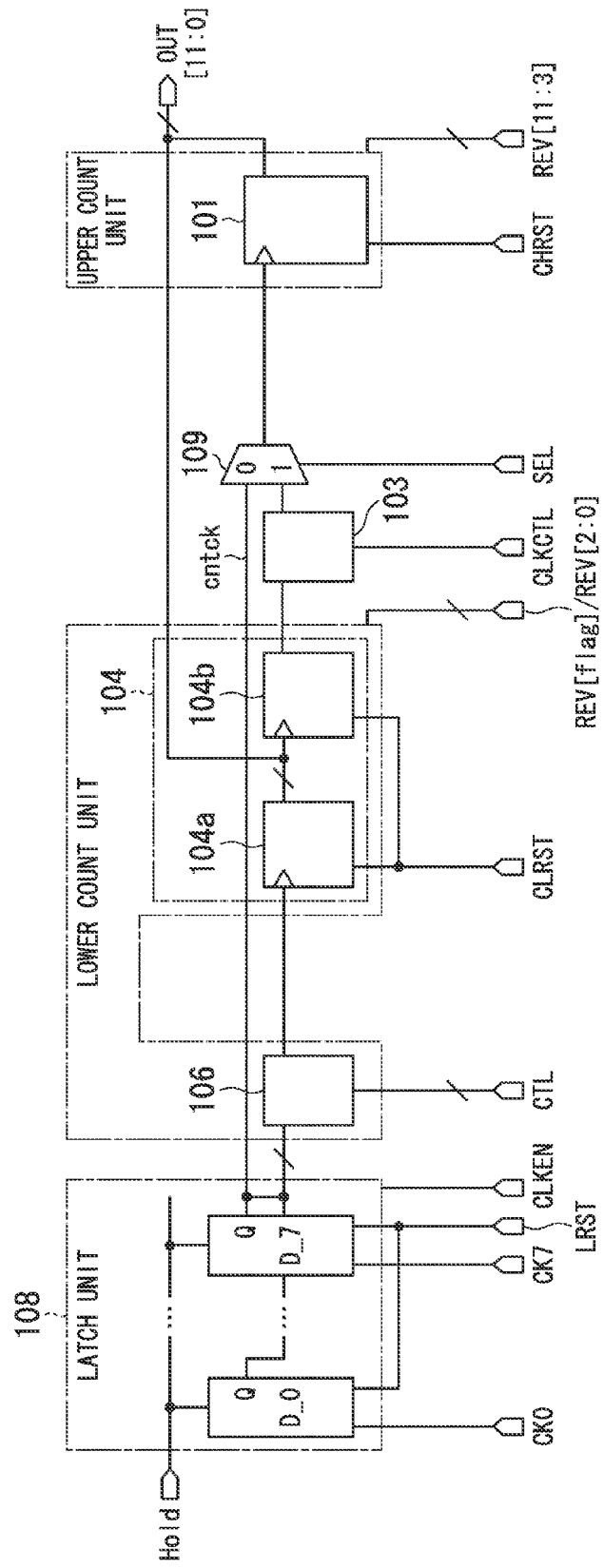
FIG. 12 is a block diagram illustrating a partial configuration of a column A/D conversion section in a second embodiment of the present invention.

Next, details of each configuration of the column A/D conversion section 16 will be described. FIG. 12 illustrates an example of a detailed configuration, from which the comparison units 110 are excluded and a unit of the elements of the column A/D conversion section 16 is extracted, in order to further describe the column A/D conversion section 16 of FIG. 11.

In FIG. 12, a connection of the modification unit 103 is changed differently from that of FIG. 2. The modification unit 103 modifies the logic state of the count clock, which is output from the lower counter 104b at the time of the switching of the count clock, to a predetermined logic state. Furthermore, in FIG. 12, a control signal CLKEN is provided to allow a count clock cntck to be in a predetermined logic state. Except for the above configuration, since the configuration of FIG. 12 is approximately the same as the configuration of FIG. 2, a redundant description will not be repeated.

Next, the operation of the configuration illustrated in FIG. 12 will be described using a detailed example. For the purpose of convenience, a description will be provided for a case in which the count mode of the upper counter 101 is the up-count mode, the count mode of the lower counter 104 (104a and 104b) is the down-count mode, and the upper counter 101 and the lower counter 104 (104a and 104b) perform the counting at the falling edge timing of a count clock. In the present embodiment, a description will be provided for a case in which a down-counter circuit of the total four bits is used as the lower counter 104 (104a and 104b) and an up-counter circuit of nine bits is used as the upper counter 101.

Hereinafter, an example in which subtraction (a CDS process) of a first pixel signal and a second pixel signal subsequent to the first pixel signal is performed will be described. In the present embodiment, binary subtraction using the complement of 2 is performed. The principle of the binary subtraction in the present embodiment is the same as that of the first embodiment. In the present embodiment, at the time of the switching of the count clock, the switching of the count clock, the adjustment of the upper count value based on the digit-up and digit-down of the lower count value, and the adjustment of the upper count value based on the binary subtraction using the complement of 2 are all performed.

Figure 13:
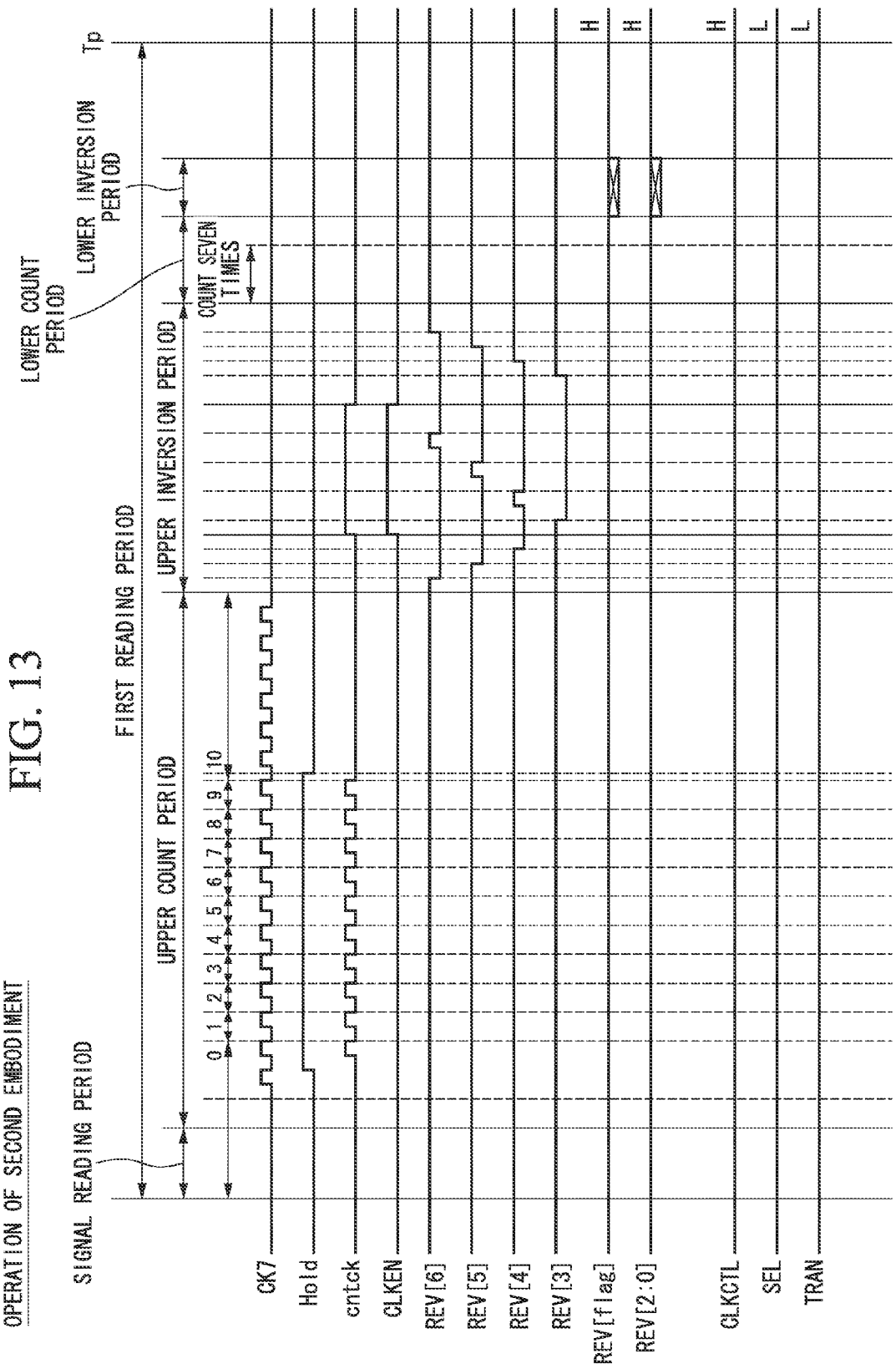
FIG. 13 is a timing chart illustrating an operation at the time of subtraction in a second embodiment of the present invention.
Figure 14:
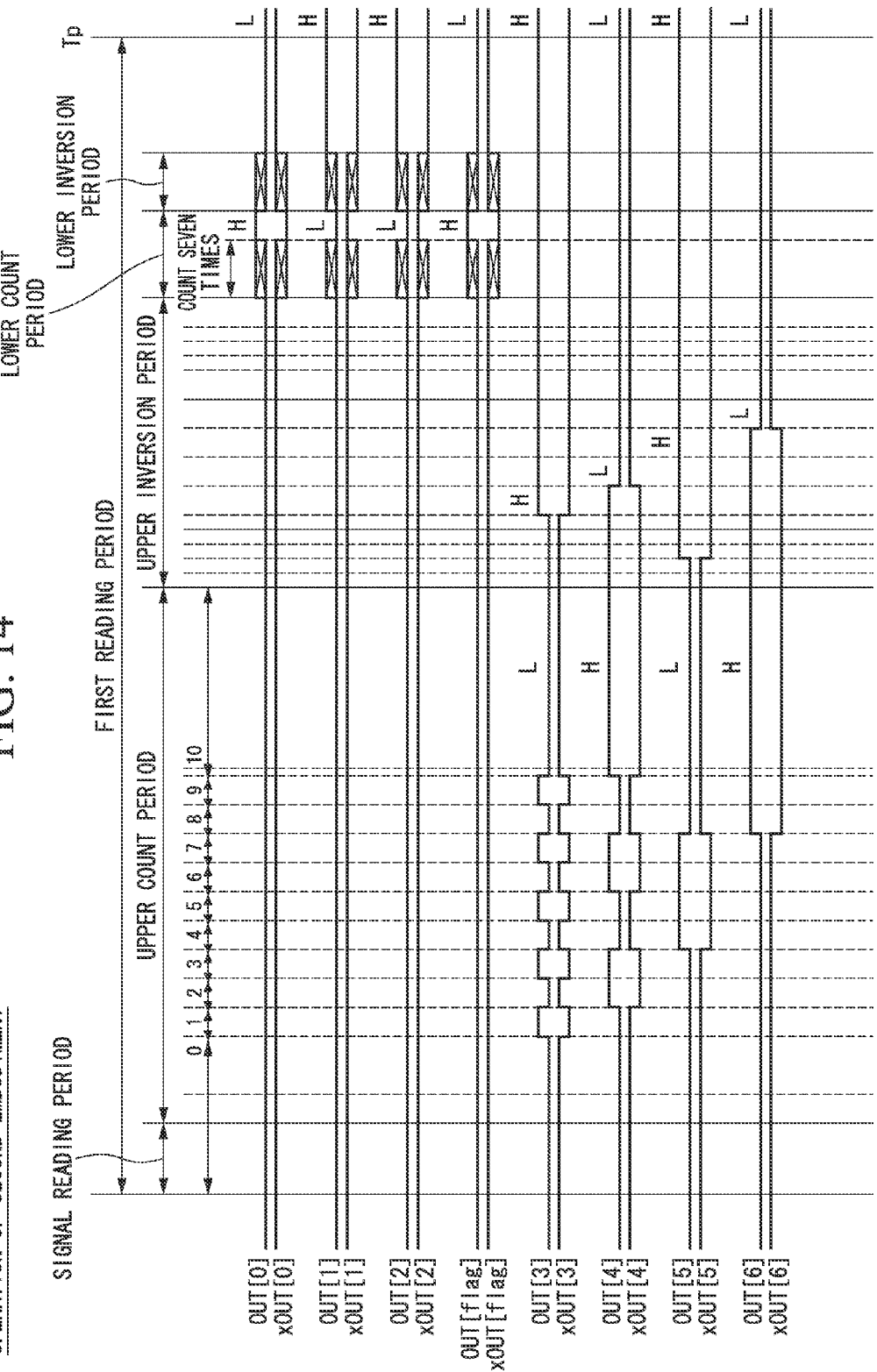
FIG. 14 is a timing chart illustrating an operation at the time of subtraction in a second embodiment of the present invention.
Figure 15:
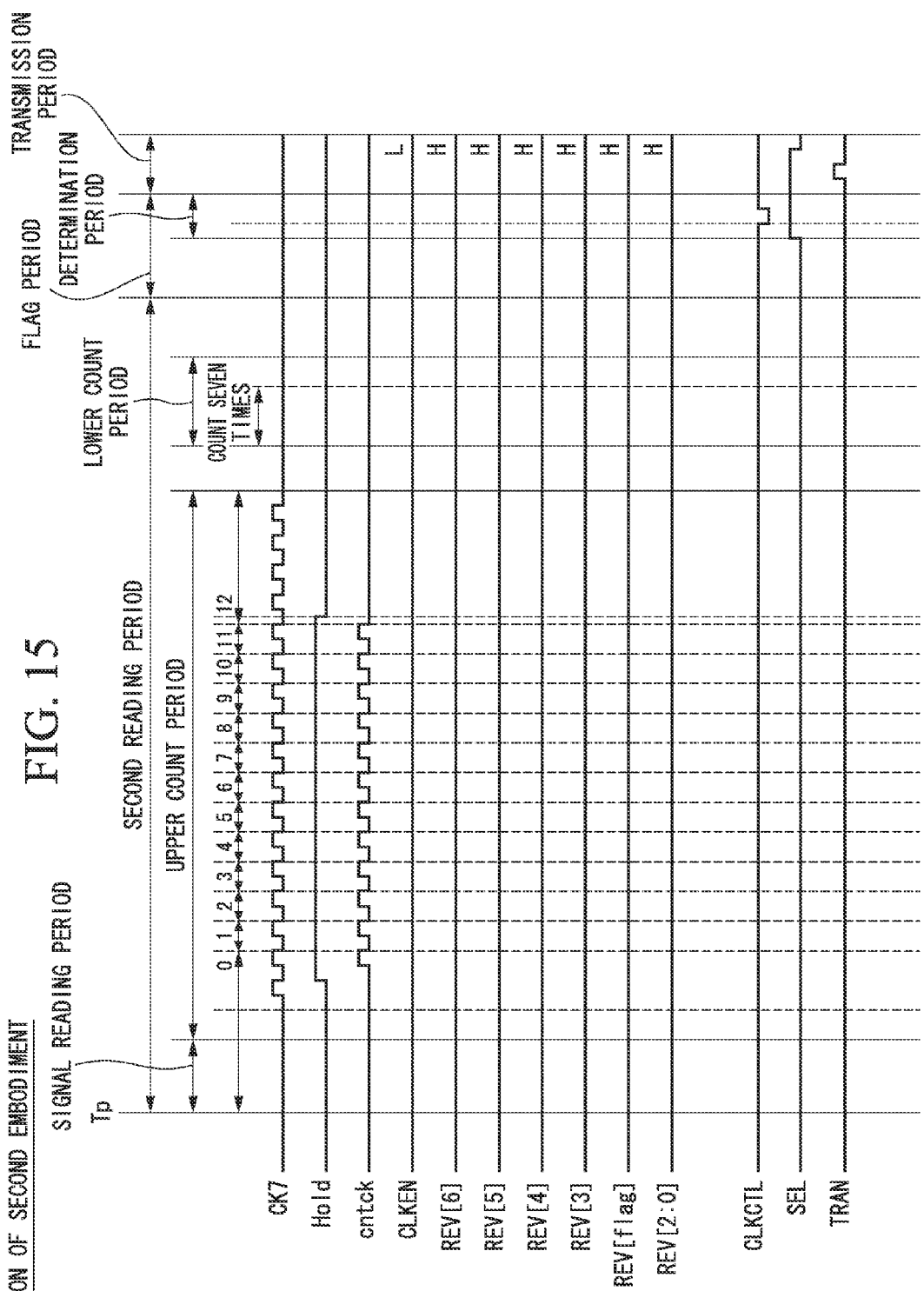
FIG. 15 is a timing chart illustrating an operation at the time of subtraction in a second embodiment of the present invention.
Figure 16:
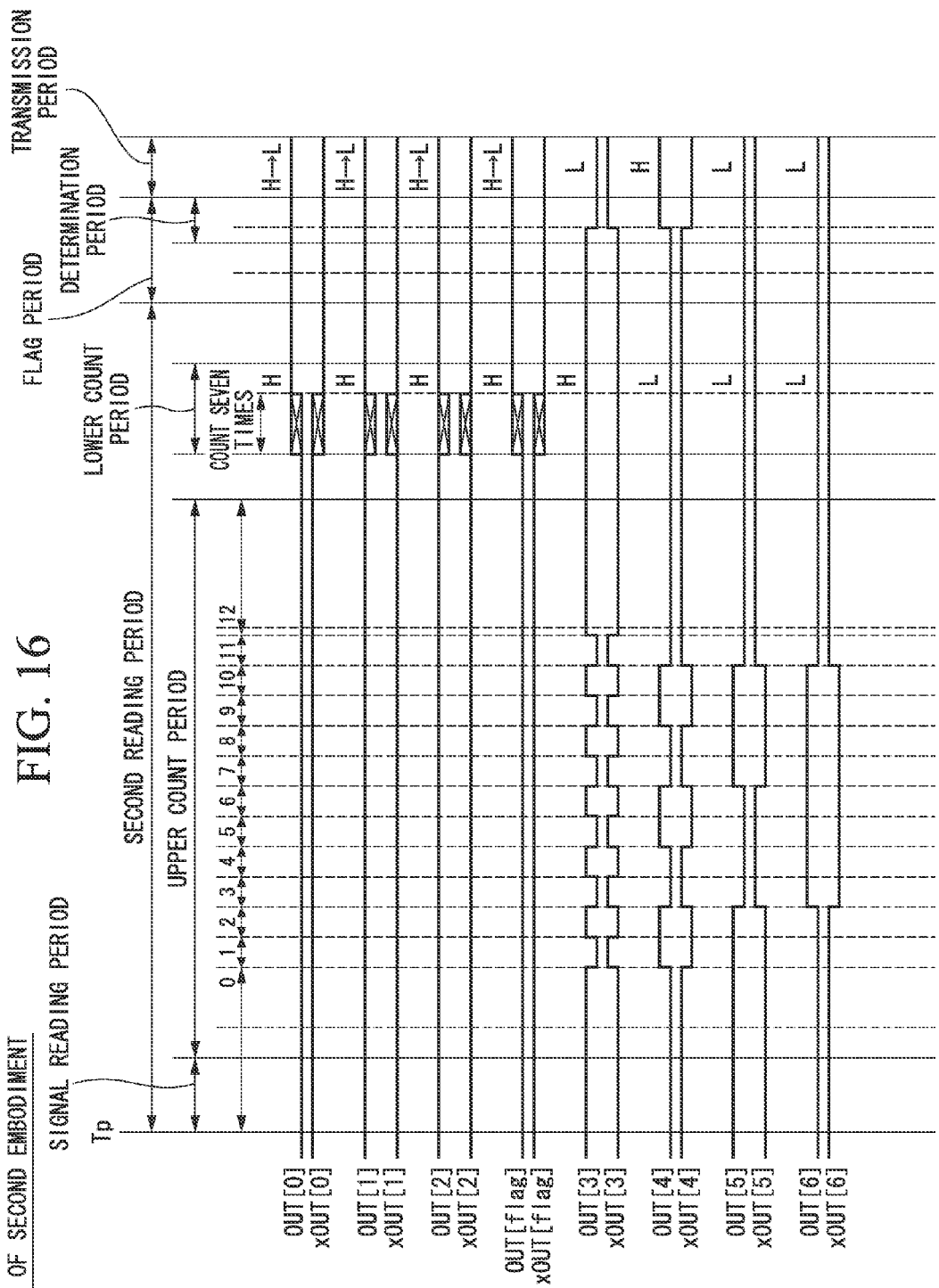
FIG. 16 is a timing chart illustrating an operation at the time of subtraction in a second embodiment of the present invention.

FIG. 13 to FIG. 16 illustrate waveforms of signals according to the operations of the present embodiment. FIG. 13 and FIG. 14 illustrate waveforms of signals at the time of the first reading, and FIG. 15 and FIG. 16 illustrate waveforms of signals at the time of the second reading. In FIG. 14 and FIG. 16, OUT[0], OUT[1], and OUT[2] indicate the output of the lower counter 104a, and xOUT[0], xOUT[1], and xOUT[2] indicate the inverted output of the lower counter 104a. OUT[flag] indicates the output of the lower counter 104b, and xOUT[flag] indicates the inverted output of the lower counter 104b. OUT[3], OUT[4], OUT[5], and OUT[6] indicate a unit of the output of the upper counter 101, and xOUT[3], xOUT[4], xOUT[5], and xOUT[6] indicate a unit of the inverted output of the upper counter 101a. TRAN indicates a control signal that transmits digital data to the output unit 17.

The operations of the present embodiment are performed in a first reading period in which the first pixel signal is read and AD-converted, a second reading period in which the second pixel signal is read and AD-converted, a flag period in which the count clock of the upper counter 101 is switched, and a transmission period in which the digital data is transmitted. The first reading period includes a signal reading period in which the first pixel signal is read, an upper count period in which the upper counter 101 performs the counting, an upper inversion period in which the upper count value of the upper counter 101 is inverted, a lower count period in which the lower counter 104 (104a and 104b) performs the counting, and a lower inversion period in which the lower count value of the lower counter 104 (104a and 104b) is inverted.

The second reading period includes a signal reading period in which the second pixel signal is read, an upper count period in which the upper counter 101 performs the counting, and a lower count period in which the lower counter 104 (104a and 104b) performs the counting. Furthermore, the flag period includes a determination period in which the modification of the logic state of the count clock of the upper counter 101 by the modification unit 103, the switching of the count clock of the upper counter 101, the adjustment of the upper count value based on the digit-up and digit-down of the lower count value, and the adjustment of the upper count value based on the binary subtraction using the complement of 2 are performed.

Here, it is assumed that a state corresponding to the lower phase signal of the first pixel signal is the state 7, an upper count value based on the first pixel signal is 10, a state corresponding to the lower phase signal of the second pixel signal is the state 7, and an upper count value based on the second pixel signal is 12. That is, the first pixel signal corresponds to 87 (=7+8 10), the second pixel signal corresponds to 103 (=7+8 12), and a value obtained by subtracting (a CDS process) the first pixel signal from the second pixel signal is 16.

<<First Reading>>

Initially, the logic states of the latch circuits D_0 to D_7 are reset by the control signal LRST. Furthermore, the count values of the lower counters 104a and 104b are reset by the control signal CLRST. Simultaneously, the count value of the upper counter 101 is reset by the control signal CHRST. Since the control signal SEL has been set as an L state, the count clock of the upper counter 101 is set as the output of the latch circuit D_7 of the latch unit 108. Accordingly, until a comparison process is completed, the clock signal CK7 is input to the upper counter 101 through the latch circuit D_7 and the switching unit 109, and the upper counter 101 performs counting using the clock signal CK7 as a count clock. At the start time point of the comparison process in the upper count period subsequent to the signal reading period, values held by the lower counters 104a and 104b are 3'b[0]000 and a value held by the upper counter 101 is 9'b0000_0000_0. If these values are expressed in 12 bits, 12'b0000_0000_0000 is obtained.

In the upper count period, at a first timing (the first timing according to the comparison of the ramp wave applied from the ramp unit 19 and the reset level in the above-mentioned operation) satisfying predetermined conditions, the control signal Hold is inverted, and the states of the clock signals CK0 to CK7, which are the logic state of the VCO100 at that time, are held (the first lower phase signal). Simultaneously, the upper counter 101 stops the count operation. At this time, values held by the lower counters 104a and 104b are 3'b[0]000 and a value held by the upper counter 101 is 9'b0000_0101_0 (corresponding to 10). If these values are expressed in 12 bits, 12'b0000_0101_0000 is obtained.

Subsequently, in the upper inversion period, the count value of the upper counter 101 is inverted. At this time, values held by the lower counters 104a and 104b are 3'b[0]000 and a value held by the upper counter 101 is 9'b1111_1010_1 (corresponding to −11). If these values are expressed in 12 bits, 12'b1111_1010_1000 is obtained. In the present embodiment, the value is inverted, and then 1 is not added.

Subsequently, in the lower count period, a binarization process of the first lower phase signal is performed. Through the binarization process of the first lower phase signal, a count clock is output from the arithmetic unit 106 to the lower counter 104a, so that the lower counter 104a performs counting. In the present embodiment, the inverted output of the third bit of the lower counter 104a is input to the lower counter 104b. At the timing at which the output of the third bit of the lower counter 104a changes from "0" to "1," the inverted output of the third bit of the lower counter 104a changes from "1" to "0," so that digit-down occurs in the count value of the lower counter 104a. By the digit-down, 1 is subtracted from the count value of the lower counter 104b. At the completion time point of the binarization process of the first lower phase signal, values held by the lower counters 104a and 104b are 3'b[1]001 (corresponding to −7) and a value held by the upper counter 101 is 9'b1111_1010_1 (corresponding to −11). If these values are expressed in 12 bits, 12'b1111_1010_1001 is obtained.

Subsequently, in the lower inversion period, the count values of the lower counters 104a and 104b are inverted. At this time, values held by the lower counters 104a and 104b are 3'b[0]110 (corresponding to 6) and a value held by the upper counter 101 is 9'b1111_1010_1 (corresponding to −11). If these values are expressed in 12 bits, 12'b1111_1010_1110 is obtained. In the present embodiment, the value is inverted, and then 1 is not added.

<<Second Reading>>

First, the latch circuits D_0 to D_7 are reset by the control signal LRST. Here, the count values of the lower counters 104a and 104b are not reset by the control signal CLRST and the count value of the upper counter 101 is not reset by the control signal CHRST. At this time, values held by the lower counters 104a and 104b are 3'b[0]110 (corresponding to 6) and a value held by the upper counter 101 is 9'b1111_1010_1 (corresponding to −11). If these values are expressed in 12 bits, 12'b1111_1010_1110 is obtained.

In the upper count period subsequent to the signal reading period, at a second timing (the second timing according to the comparison of the ramp wave applied from the ramp unit 19 and the signal level in the above-mentioned operation) satisfying predetermined conditions, the control signal Hold is inverted, and the states of the clock signals CK0 to CK7, which are the logic state of the VCO100 at that time, are held (the second lower phase signal). Simultaneously, the upper counter 101 stops the count operation. At this time, values held by the lower counters 104a and 104b are 3'b[0]110 (corresponding to 6) and a value held by the upper counter 101 is 9'b0000_0000_1 (corresponding to 1). If these values are expressed in 12 bits, 12'b0000_0000_1110 is obtained.

Subsequently, in the lower count period, a binarization process of the second lower phase signal is performed. Through the binarization process of the second lower phase signal, a count clock is output from the arithmetic unit 106 to the lower counter 104a, so that the lower counter 104a performs counting. In the present embodiment, the inverted output of the third bit of the lower counter 104a is input to the lower counter 104b. At the timing at which the output of the third bit of the lower counter 104a changes from "0" to "1," the inverted output of the third bit of the lower counter 104a changes from "1" to "0," so that digit-down occurs in the count value of the lower counter 104a. By the digit-down, 1 is subtracted from the count value of the lower counter 104b. At the completion time point of the binarization process of the first lower phase signal, values held by the lower counters 104a and 104b are 3'b[1]111 (corresponding to −1) and a value held by the upper counter 101 is 9'b0000_0000_1 (corresponding to 1). If these values are expressed in 12 bits, 12'b0000_0000_1111 is obtained.

Subsequently, in the flag period, the count clock input to the upper counter 101 is switched. In the present embodiment, the second count clock, which is a count clock after the switching, is the inverted output of the lower counter 104b. Here, as the second count clock, an L state is output when the digit-up or digit-down occurs in the lower count value and an H state is output when no digit-up or digit-down occurs in the lower count value.

First, in the determination period of the flag period, the control signal SEL enters an H state from an L state, so that a count clock is switched to a count clock (the output of the modification unit 103) fixed to an H state by the control signal CLKCTL. Then, the control signal CLKCTL enters an L state from an H state. The inverted output of the lower counter 104b input to the modification unit 103 is in an L state and the control signal CLKCTL changes to the L state from the H state, so that 1 is added to the count value of the upper counter 101. At this time, values held by the lower counters 104a and 104b are 3'b[1]111 (corresponding to −1) and a value held by the upper counter 101 is 9'b0000_0001_0 (corresponding to 2). If these values are expressed in 12 bits, 12'b0000_0001_0111 is obtained.

Subsequently, only the count values of the lower counters 104a and 104b are inverted (omitted in FIG. 13 to FIG. 16). At this time, values held by the lower counters 104a and 104b are 3'b[0]000 (corresponding to 0) and a value held by the upper counter 101 is 9'b0000_0001_0 (corresponding to 2). If these values are expressed in 12 bits, 12'b0000_0001_0000 (corresponding to 16) is obtained. In the binary subtraction, a value is inverted and then 1 should be added. However, as described above, since a value is also inverted at the time of the first reading, 1 is added after each inversion, so that a change in a value is offset. Accordingly, in the present embodiment, in relation to the lower count value, a value is inverted and then 1 is not added. Furthermore, in relation to the upper count value, adjustment according to addition of 1 after the value is inverted is performed together with adjustment based on the digit-up and digit-down of the lower count value at the time of the switching of the count clock.

In the transmission period, digital data including the second lower count value and the second upper count value is transmitted to the output unit 17 by the horizontal selection unit 14 through the horizontal signal line. Through the above operation, binary data corresponding to the difference between the first pixel signal and the second pixel signal is obtained.

As described above, according to the present embodiment, the modification unit 103 modifies the logic state of the count clock to a predetermined state at the time of the switching of the count clock, so that it may prevent an error of the count value depending on the logic state of the count clock before the switching. Furthermore, since it is sufficient if the lower counters 104a and 104b and the upper counter 101 have only one type of count mode (the lower counters 104a and 104b have the down-count mode and the upper counter 101 has the up-count mode in the present embodiment), it is possible to realize the A/D conversion circuit using a simple circuit configuration.

Third Embodiment

Next, a third embodiment of the present invention will be described. Since the configuration of the imaging device according to the present embodiment is the same as the configuration illustrated in FIG. 11, a redundant description will not be repeated. Furthermore, since the configuration of the column A/D conversion section 16 of the present embodiment is approximately the same as the configuration illustrated in FIG. 12, a redundant description will not be repeated. However, instead of the control signal CHRST that resets the upper count value of the upper counter 101, a control signal CHSET that resets the upper count value of the upper counter 101 to a predetermined value is provided.

Next, the operations of the present embodiment will be described using a detailed example. For the purpose of convenience, a description will be provided for a case in which the count modes of the upper counter 101 and the lower counter 104 are the down-count mode, and the upper counter 101 and the lower counter 104 perform the counting at the falling edge timing of a count clock. In the present embodiment, a description will be provided for a case in which a down-counter circuit of the total four bits is used as the lower counter 104 (104a and 104b) and a down-counter circuit of nine bits is used as the upper counter 101.

Hereinafter, an example in which subtraction (a CDS process) of a first pixel signal and a second pixel signal subsequent to the first pixel signal is performed will be described. In the present embodiment, binary subtraction using the complement of 2 is performed.

When a digital value obtained by AD-converting the first pixel signal is set as A and a digital value obtained by AD-converting the second pixel signal is set as B, a subtraction result to be obtained is B−A. In the present embodiment, the lower counter 104 (104a and 104b) and the upper counter 101 separately perform the counting, resulting in the achievement of digital data including the lower count value as a counting result of the lower counter 104 (104a and 104b) and the upper count value as a counting result of the upper counter 101.

In the present embodiment, since the lower counter 104 (104a and 104b) performs the counting in the down-count mode, a lower count value after the lower counter 104 (104a and 104b) performs the counting based on the first pixel signal at the time of first reading and further performs inversion corresponds to a lower bit of the digital value A. However, since the complement of 2 is used, it is necessary to add 1 to the lower count value. Subsequently, a lower count value after the lower counter 104 (104a and 104b) performs the counting based on the second pixel signal at the time of second reading and further performs inversion corresponds to a lower bit of the digital value B−A. However, since the complement of 2 is used, it is necessary to add 1 to the lower count value. Since a change in the value by the addition of 1 required after the inversion at the time of the first reading and a change in the value by the addition of 1 required after the inversion at the time of the second reading are offset from each other, the addition of 1 is not performed after the inversion.

Meanwhile, in the present embodiment, since the upper counter 101 performs the counting in the down-count mode, an upper count value after the upper counter 101 performs the counting based on the first pixel signal at the time of the first reading and further performs inversion corresponds to an upper bit of the digital value A. However, since the complement of 2 is used, it may add 1 to the upper count value. Subsequently, an upper count value after the upper counter 101 performs the counting based on the second pixel signal at the time of the second reading and further performs inversion corresponds to an upper bit of the digital value B−A. However, since the complement of 2 is used, it may add 1 to the upper count value. Since a change in the value by the addition of 1 required after the inversion at the time of the first reading and a change in the value by the addition of 1 required after the inversion at the time of the second reading are offset from each other, the addition of 1 is not performed after the inversion.

At the time of the second reading, the lower count value and the upper count value are inverted. However, after this inversion, the lower count value should be a positive number. In other words, the count value of the lower counter 104b after the inversion should be 0, meaning that the count value of the lower counter 104b before the inversion should be 1. In the case in which the count value of the lower counter 104b after the inversion is 1, since it may subtract 1 from the count value of the upper counter 101, when the count value of the lower counter 104b before the inversion is 0, it may add 1 to the count value of the upper counter 101 before the inversion. Furthermore, in the case in which the count value of the lower counter 104b before the inversion is 1, it may not adjust the count value of the upper counter 101 before the inversion. However, when it may add 1 to the count value of the upper counter 101 before the inversion, since the upper counter 101 performs the counting in the down-count mode in the present embodiment, it may not perform addition.

Meanwhile, when the operation has been started after an initial value of the count value of the upper counter 101 is set as a value obtained by subtracting 1 from a value at the time of reset, 1 has been excessively added to the count value of the upper counter 101 at the start time point of the second reading after the count value of the upper counter 101 is inverted at the time of the first reading. That is, it is necessary to subtract 1 from the count value of the upper counter 101 at the start time point of the second reading. Therefore, after the operation has been started after the initial value of the count value of the upper counter 101 is set as the value obtained by subtracting 1 from the value at the time of reset, when the count value of the lower counter 104b before the inversion in the second reading is 0, it may not adjust the upper count value before the inversion. When the count value of the lower counter 104b before the inversion in the second reading is 1, it may subtract 1 from the upper count value before the inversion. In the present embodiment, since the upper counter 101 performs the counting in the down-count mode, it may perform subtraction. In the present embodiment, at the time of the switching of the count clock, the switching of the count clock and the adjustment of the upper count value based on the shift-up and shift-down of the lower count value are all performed.

Figure 17:
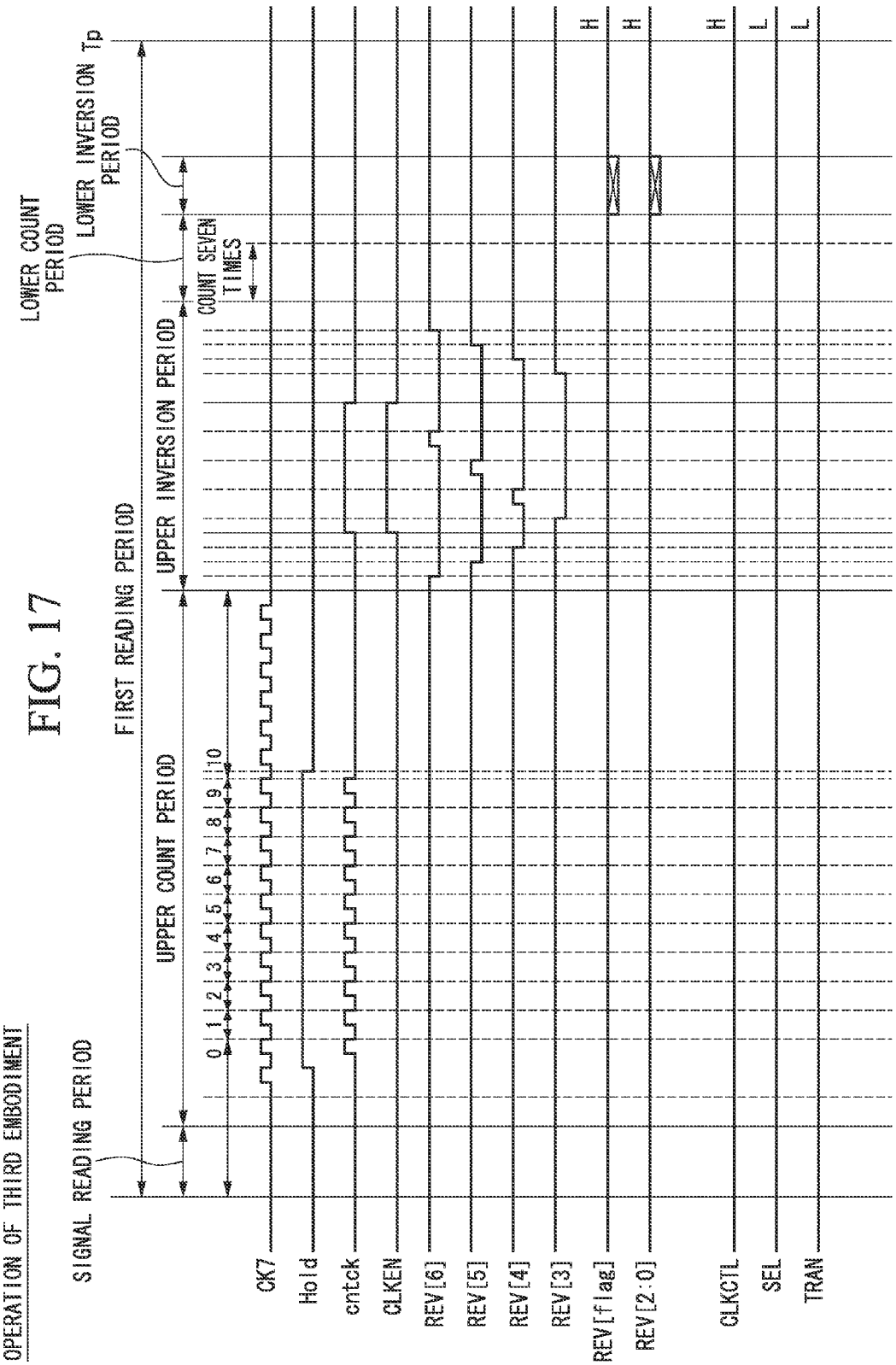
FIG. 17 is a timing chart illustrating an operation at the time of subtraction in a third embodiment of the present invention.
Figure 18:
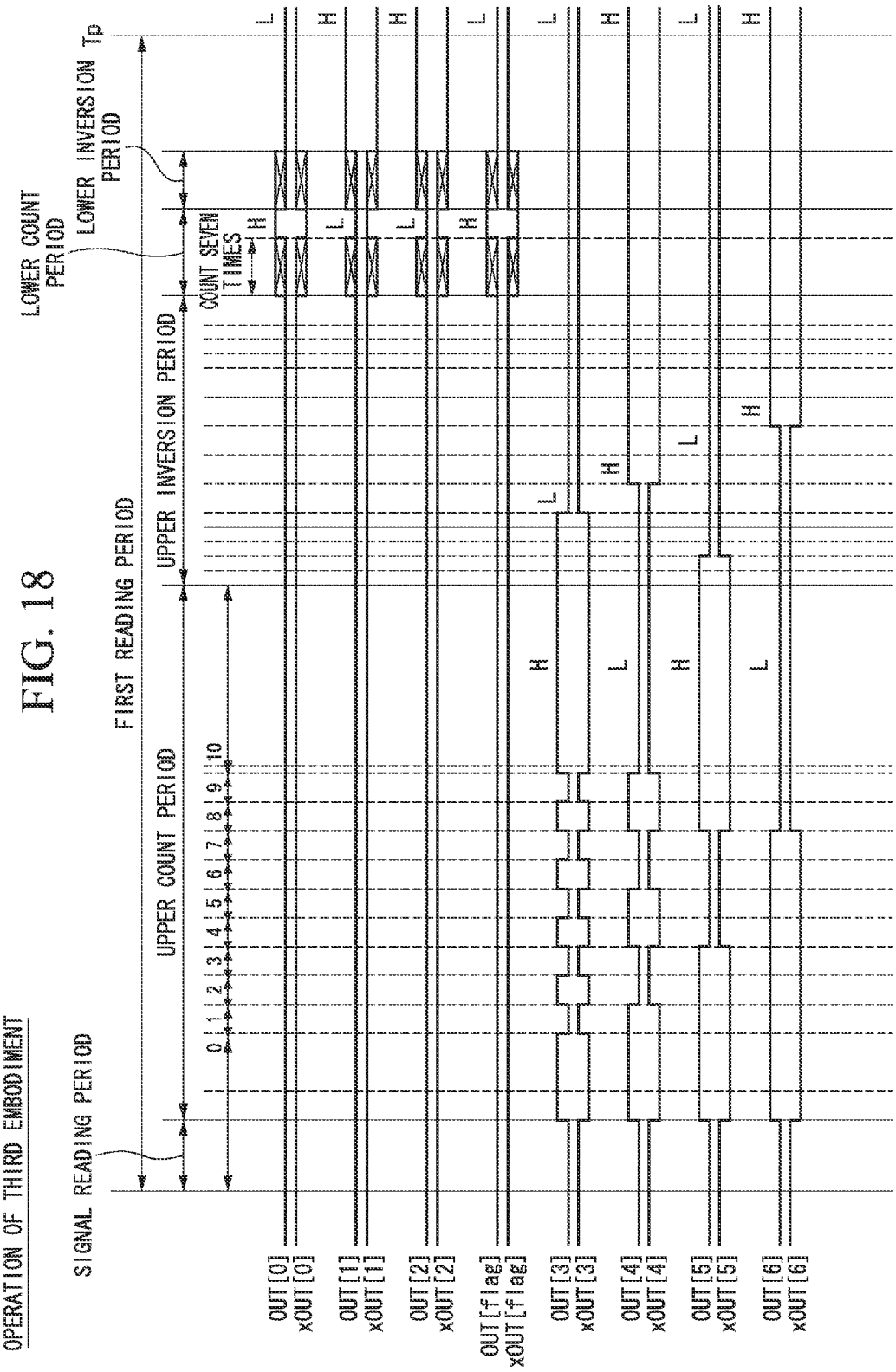
FIG. 18 is a timing chart illustrating an operation at the time of subtraction in a third embodiment of the present invention.
Figure 19:
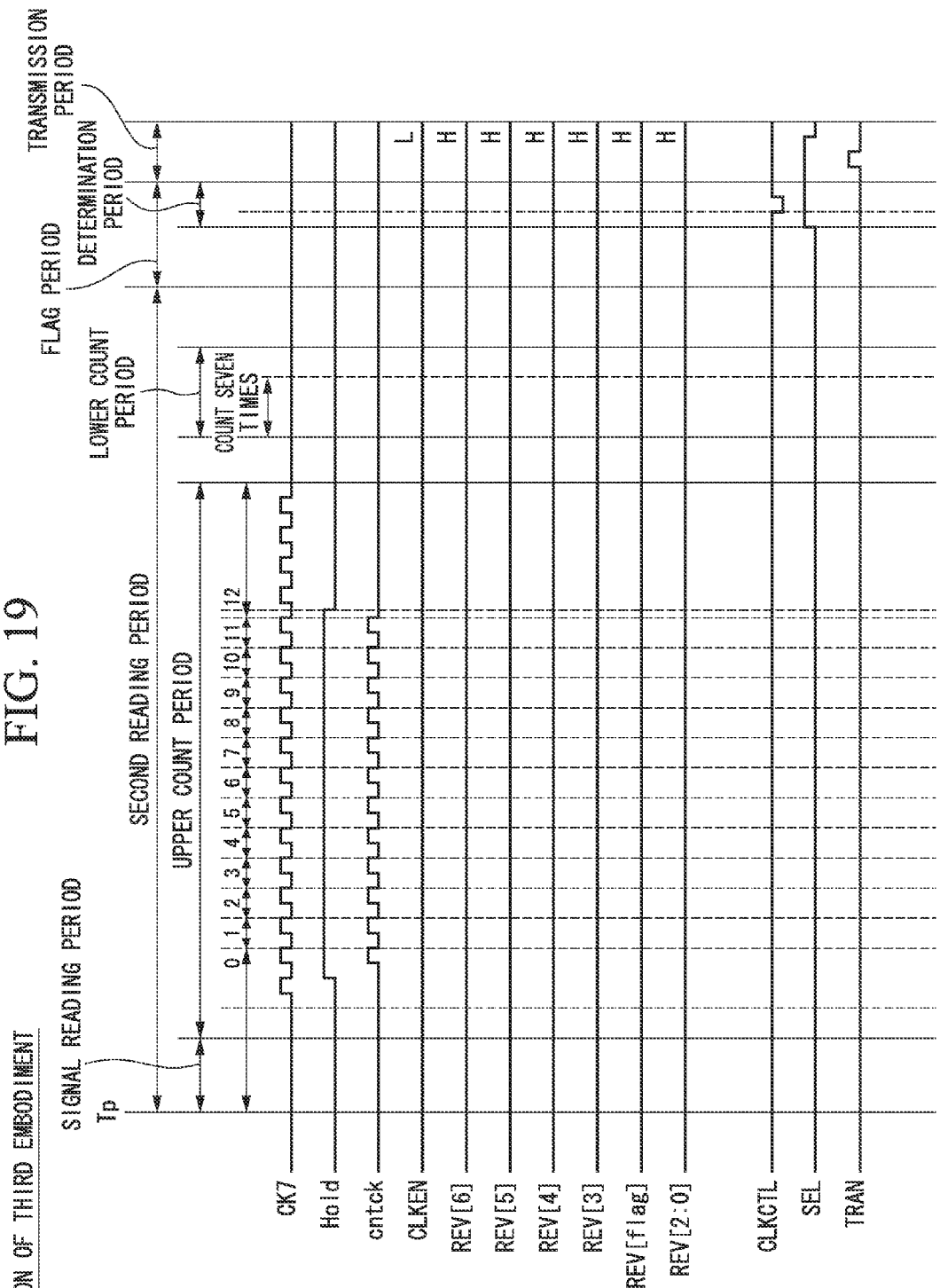
FIG. 19 is a timing chart illustrating an operation at the time of subtraction in a third embodiment of the present invention.
Figure 20:
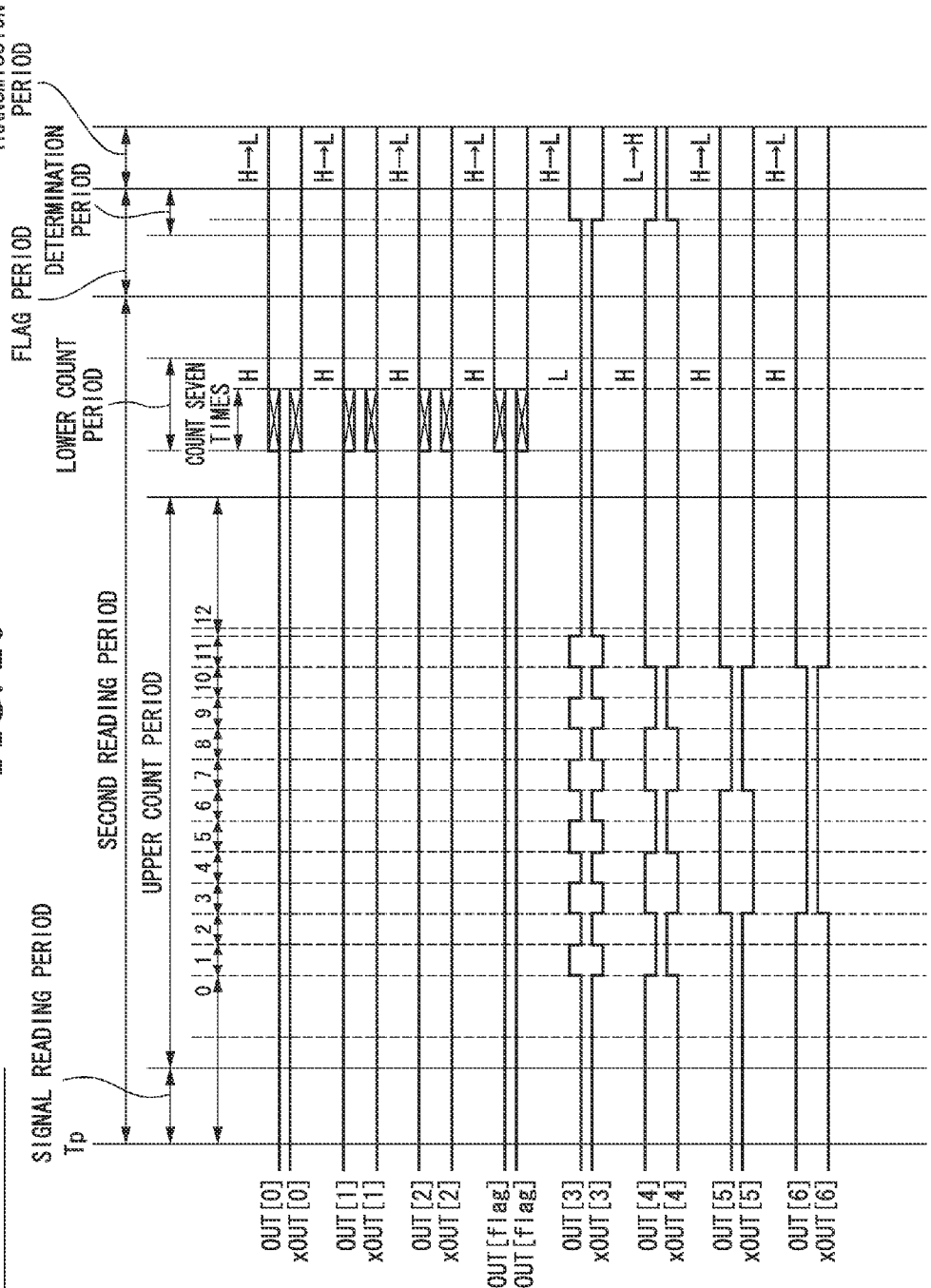
FIG. 20 is a timing chart illustrating an operation at the time of subtraction in a third embodiment of the present invention.

FIG. 17 to FIG. 20 illustrate waveforms of signals according to the operations of the present embodiment. FIG. 17 and FIG. 18 illustrate waveforms of signals at the time of the first reading, and FIG. 19 and FIG. 20 illustrate waveforms of signals at the time of the second reading. In FIG. 18 and FIG. 20, OUT[0], OUT[1], and OUT[2] indicate the output of the lower counter 104a, and xOUT[0], xOUT[1], and xOUT[2] indicate the inverted output of the lower counter 104a. OUT [flag] indicates the output of the lower counter 104b, and xOUT[flag] indicates the inverted output of the lower counter 104b. OUT[3], OUT[4], OUT[5], and OUT[6] indicate a unit of the output of the upper counter 101, and xOUT[3], xOUT [4], xOUT[5], and xOUT[6] indicate a unit of the inverted output of the upper counter 101a. TRAN indicates a control signal that transmits digital data to the output unit 17.

The operations of the present embodiment are performed in a first reading period in which the first pixel signal is read and AD-converted, a second reading period in which the second pixel signal is read and AD-converted, a flag period in which the count clock of the upper counter 101 is switched, and a transmission period in which the digital data is transmitted. The first reading period includes a signal reading period in which the first pixel signal is read, an upper count period in which the upper counter 101 performs the counting, an upper inversion period in which the upper count value of the upper counter 101 is inverted, a lower count period in which the lower counter 104 (104a and 104b) performs the counting, and a lower inversion period in which the lower count value of the lower counter 104 (104a and 104b) is inverted.

The second reading period includes a signal reading period in which the second pixel signal is read, an upper count period in which the upper counter 101 performs the counting, and a lower count period in which the lower counter 104 (104a and 104b) performs the counting. Furthermore, the flag period includes a determination period in which the modification of the logic state of the count clock of the upper counter 101 by the modification unit 103, the switching of the count clock of the upper counter 101, and the adjustment of the upper count value based on the digit-up and digit-down of the lower count value are performed.

Here, it is assumed that a state corresponding to the lower phase signal of the first pixel signal is the state 7, an upper count value based on the first pixel signal is 10, a state corresponding to the lower phase signal of the second pixel signal is the state 7, and an upper count value based on the second pixel signal is 12. That is, the first pixel signal corresponds to 87 (=7+8 10), the second pixel signal corresponds to 103 (=7+8 12), and a value obtained by subtracting (a CDS process) the first pixel signal from the second pixel signal is 16.

<<First Reading>>

Initially, the logic states of the latch circuits D_0 to D_7 are reset by the control signal LRST. Furthermore, the count values of the lower counters 104a and 104b are reset by the control signal CLRST. Simultaneously, the count value of the upper counter 101 is reset to a predetermined value (in this case, 9'b1111_1111_1) by the control signal CHSET (not illustrated). Since the control signal SEL has been set to an L state, the count clock of the upper counter 101 is set as the output of the latch circuit D_7 of the latch unit 108. Accordingly, until a comparison process is completed, the clock signal CK7 is input to the upper counter 101 through the latch circuit D_7 and the switching unit 109, and the upper counter 101 performs counting using the clock signal CK7 as a count clock. At the start time point of the comparison process in the upper count period subsequent to the signal reading period, values held by the lower counters 104a and 104b are 3'b[0]000 and a value held by the upper counter 101 is 9'b1111_1111_1. If these values are expressed as 12 bits, 12'b1111_1111_1000 is obtained.

In the upper count period, at a first timing (the first timing according to the comparison of the ramp wave applied from the ramp unit 19 and the reset level in the above-mentioned operation) satisfying predetermined conditions, the control signal Hold is inverted, and the states of the clock signals CK0 to CK7, which are the logic state of the VCO100 at that time, are held (the first lower phase signal). Simultaneously, the upper counter 101 stops the count operation. At this time, values held by the lower counters 104a and 104b are 3'b[0]000 and a value held by the upper counter 101 is 9'b1111_1010_1 (corresponding to −11). If these values are expressed in 12 bits, 12'b1111_1010_1000 is obtained.

Subsequently, in the upper inversion period, the count value of the upper counter 101 is inverted. At this time, values held by the lower counters 104a and 104b are 3'b[0]000 and a value held by the upper counter 101 is 9'b0000_0101_0 (corresponding to 10). If these values are expressed in 12 bits, 12'b0000_0101_0000 is obtained. In the present embodiment, the value is inverted, and then 1 is not added.

Subsequently, in the lower count period, a binarization process of the first lower phase signal is performed. Through the binarization process of the first lower phase signal, a count clock is output from the arithmetic unit 106 to the lower counter 104a, so that the lower counter 104a performs counting. In the present embodiment, the inverted output of the third bit of the lower counter 104a is input to the lower counter 104b. At the timing at which the output of the third bit of the lower counter 104a changes from "0" to "1," the inverted output of the third bit of the lower counter 104a changes from "1" to "0," so that digit-down occurs in the count value of the lower counter 104a. By the digit-down, 1 is subtracted from the count value of the lower counter 104b. At the completion time point of the binarization process of the first lower phase signal, values held by the lower counters 104a and 104b are 3'b[1]001 (corresponding to −7) and a value held by the upper counter 101 is 9'b0000_0101_0 (corresponding to 10). If these values are expressed in 12 bits, 12'b0000_0101_0001 is obtained.

Subsequently, in the lower inversion period, the count values of the lower counters 104a and 104b are inverted. At this time, values held by the lower counters 104a and 104b are 3'b[0]110 (corresponding to 6) and a value held by the upper counter 101 is 9'b0000_0101_0 (corresponding to 10). If these values are expressed in 12 bits, 12'b0000_0101_0110 is obtained. In the present embodiment, the value is inverted, and then 1 is not added.

<<Second Reading>>

First, the latch circuits D_0 to D_7 are reset by the control signal LRST. Here, the count values of the lower counters 104a and 104b are not reset by the control signal CLRST and the count value of the upper counter 101 is not reset by the control signal CHSET. At this time, values held by the lower counters 104a and 104b are 3'b[0]110 (corresponding to 6) and a value held by the upper counter 101 is 9'b0000_0101_0 (corresponding to 10). If these values are expressed in 12 bits, 12'b0000_0101_0110 is obtained.

In the upper count period subsequent to the signal reading period, at a second timing (the second timing according to the comparison of the ramp wave applied from the ramp unit 19 and the signal level in the above-mentioned operation) satisfying predetermined conditions, the control signal Hold is inverted, and the states of the clock signals CK0 to CK7, which are the logic state of the VCO100 at that time, are held (the second lower phase signal). Simultaneously, the upper counter 101 stops the count operation. At this time, values held by the lower counters 104a and 104b are 3'b[0]110 (corresponding to 6) and a value held by the upper counter 101 is 9'b1111_1111_0 (corresponding to −2). If these values are expressed in 12 bits, 12'b1111_1111_0110 is obtained.

Subsequently, in the lower count period, a binarization process of the second lower phase signal is performed. Through the binarization process of the second lower phase signal, a count clock is output from the arithmetic unit 106 to the lower counter 104a, so that the lower counter 104a performs counting. In the present embodiment, the inverted output of the third bit of the lower counter 104a is input to the lower counter 104b. At the timing at which the output of the third bit of the lower counter 104a changes from "0" to "1," the inverted output of the third bit of the lower counter 104a changes from "1" to "0," so that digit-down occurs in the count value of the lower counter 104a. By the digit-down, 1 is subtracted from the count value of the lower counter 104b. At the completion time point of the binarization process of the second lower phase signal, values held by the lower counters 104a and 104b are 3'b[1]111 (corresponding to −1) and a value held by the upper counter 101 is 9'b1111_1111_0 (corresponding to −2). If these values are expressed in 12 bits, 12'b1111_1111_0111 is obtained.

Subsequently, in the flag period, the count clock input to the upper counter 101 is switched. In the present embodiment, the second count clock, which is a count clock after the switching, is the inverted output of the lower counter 104b. Here, as the second count clock, an L state is output when the digit-up or digit-down occurs in the lower count value and an H state is output when no digit-up or digit-down occurs in the lower count value.

First, in the determination period of the flag period, the control signal SEL enters an H state from an L state, so that a count clock is switched to a count clock (the output of the modification unit 103) fixed to an H state by the control signal CLKCTL. Then, the control signal CLKCTL enters an L state from an H state. The inverted output of the lower counter 104b input to the modification unit 103 is in an L state and the control signal CLKCTL changes to the L state from the H state, so that 1 is subtracted from the count value of the upper counter 101. At this time, values held by the lower counters 104a and 104b are 3'b[1]111 (corresponding to −1) and a value held by the upper counter 101 is 9'b1111_1110_1 (corresponding to −3). If these values are expressed in 12 bits, 12'b1111_1110_1111 is obtained.

Subsequently, the count values of the lower counters 104a and 104b and the upper counter 101 are inverted (omitted in FIG. 17 to FIG. 20). At this time, values held by the lower counters 104a and 104b are 3'b[0]000 (corresponding to 0) and a value held by the upper counter 101 is 9'b0000_0001_0 (corresponding to 2). If these values are expressed in 12 bits, 12'b0000_0001_0000 (corresponding to 16) is obtained. In the binary subtraction, a value is inverted and then 1 should be added. However, as described above, since a value is also inverted at the time of the first reading, 1 is added after each inversion, so that a change in a value is offset. Accordingly, in the present embodiment, the lower count value and the upper count value are inverted, and then 1 is not added.

In the transmission period, digital data including the second lower count value and the second upper count value is transmitted to the output unit 17 by the horizontal selection unit 14 through the horizontal signal line. Through the above operation, binary data corresponding to the difference between the first pixel signal and the second pixel signal is obtained.

As described above, according to the present embodiment, the modification unit 103 modifies the logic state of the count clock to a predetermined state at the time of the switching of the count clock, so that it may prevent an error of the count value depending on the logic state of the count clock before the switching. Furthermore, since it is sufficient if the lower counters 104a and 104b and the upper counter 101 have only one type of count mode (the down-count mode in the present embodiment), it may realize the A/D conversion circuit using a simple circuit configuration.

Furthermore, the count value of the upper counter 101 is initially set as a predetermined value, so that it may adjust the count value of the upper counter 101 in response to the digit-down of the count values of the lower counter 104a and 104b, without a change in the count mode.

Fourth Embodiment

Figure 21:
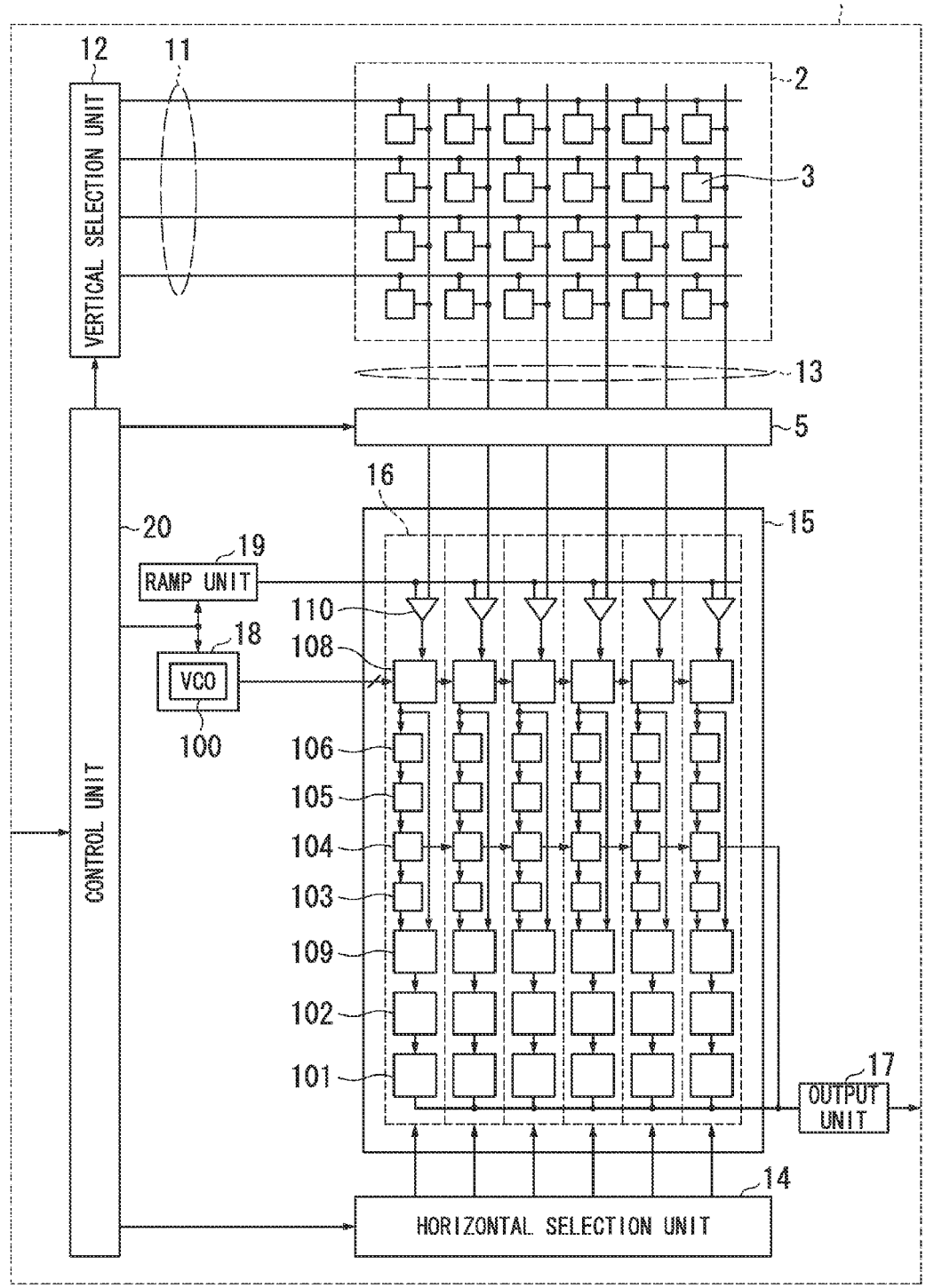
FIG. 21 is a block diagram illustrating a configuration of an imaging device according to a fourth embodiment of the present invention.

Next, a fourth embodiment of the present invention will be described. FIG. 21 illustrates an example of the configuration of a (C)MOS imaging device according to the present embodiment. Since the configuration of the imaging device according to the present embodiment is the same as the configuration illustrated in FIG. 1, except for the column A/D conversion section 16, a redundant description will not be repeated.

Figure 22:
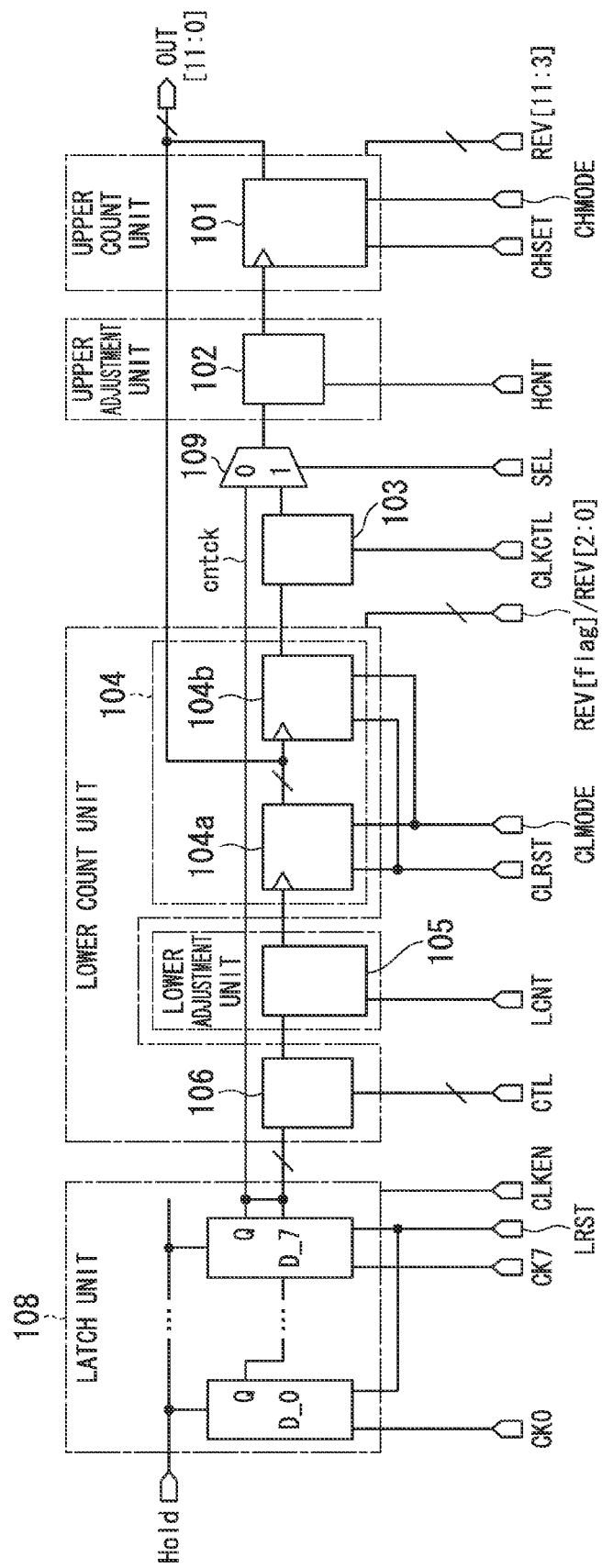
FIG. 22 is a block diagram illustrating a partial configuration of a column A/D conversion section in a fourth embodiment of the present invention.

Next, details of each configuration of the column A/D conversion section 16 will be described. FIG. 22 illustrates an example of a detailed configuration, from which the comparison units 110 are excluded and a unit of the elements of the column A/D conversion section 16 is extracted, in order to further describe the column A/D conversion section 16 of FIG. 21.

In FIG. 22, a lower adjustment circuit 105 and an upper adjustment circuit 102 are additionally provided, differently from FIG. 12. Furthermore, instead of the control signal CHRST that resets the upper count value of the upper counter 101, a control signal CHSET that resets the upper count value of the upper counter 101 to a predetermined value is provided.

The lower adjustment circuit 105 constitutes a lower adjustment unit, generates a count clock for adjustment for adjusting an inverted value of the lower count value, which has been held by the lower counter 104, based on a control signal LCNT, and outputs the count clock for adjustment to the lower counter 104. The upper adjustment circuit 102 constitutes an upper adjustment unit, generates a count clock for adjustment for adjusting an inverted value of the value, which has been held by the upper counter 101, based on a control signal HCNT, and outputs the count clock for adjustment to the upper counter 101. Except for the above configuration, since the configuration of FIG. 22 is approximately the same as the configuration of FIG. 12, a redundant description will not be repeated.

Next, the operations of the present embodiment will be described using a detailed example. For the purpose of convenience, a description will be provided for a case in which the count modes of the upper counter 101 and the lower counter 104 are the up-count mode, and the upper counter 101 and the lower counter 104 perform the counting at the falling edge timing of a count clock. In the present embodiment, a description will be provided for a case in which an up-counter circuit of the total four bits is used as the lower counter 104 (104a and 104b) and an up-counter circuit of nine bits is used as the upper counter 101.

Hereinafter, an example in which subtraction (a CDS process) of a first pixel signal and a second pixel signal subsequent to the first pixel signal is performed will be described. In the present embodiment, binary subtraction using the complement of 2 is performed.

When a digital value obtained by AD-converting the first pixel signal is set as A and a digital value obtained by AD-converting the second pixel signal is set as B, a subtraction result to be obtained is B−A. In the present embodiment, the lower counter 104 (104a and 104b) and the upper counter 101 separately perform the counting, resulting in the achievement of digital data including the lower count value as a counting result of the lower counter 104 (104a and 104b) and the upper count value as a counting result of the upper counter 101.

In the present embodiment, since the lower counter 104 (104a and 104b) performs the counting in the up-count mode, a lower count value after the lower counter 104 (104a and 104b) performs the counting based on the first pixel signal at the time of first reading and further performs inversion corresponds to a lower bit of the digital value −A. However, since the complement of 2 is used, it may add 1 to the lower count value. The lower counter 104 (104a and 104b) performs the counting based on the count clock from the lower adjustment circuit 105, so that addition of 1 is performed. Subsequently, a lower count value after the lower counter 104 (104a and 104b) performs the counting based on the second pixel signal at the time of second reading corresponds to a lower bit of the digital value B−A.

Meanwhile, in the present embodiment, since the upper counter 101 performs the counting in the up-count mode, an upper count value after the upper counter 101 performs the counting based on the first pixel signal at the time of the first reading and further performs inversion corresponds to an upper bit of the digital value −A. However, since the complement of 2 is used, it is necessary to add 1 to the upper count value. The upper counter 101 performs the counting based on the count clock from the upper adjustment circuit 102, so that addition of 1 is performed. Subsequently, an upper count value after the upper counter 101 performs the counting based on the second pixel signal at the time of the second reading corresponds to an upper bit of the digital value B−A.

When the count value of the lower counter 104b in the second reading is 1, since the lower count value is a negative number, it may subtract 1 from the count value of the upper counter 101. When the count value of the lower counter 104b is 0, it may not adjust the count value of the upper counter 101. However, when it may subtract 1 from the count value of the upper counter 101, since the upper counter 101 performs the counting in the up-count mode in the present embodiment, it is not possible to perform subtraction.

Meanwhile, when the operation has been started after an initial value of the count value of the upper counter 101 is set as a value obtained by adding 1 to a value at the time of reset, 1 has been excessively subtracted from the count value of the upper counter 101 at the start time point of the second reading after the count value of the upper counter 101 is inverted at the time of the first reading. That is, it may add 1 to the count value of the upper counter 101 at the start time point of the second reading. Therefore, after the operation has been started after the initial value of the count value of the upper counter 101 is set as the value obtained by adding 1 to the value at the time of reset, when the count value of the lower counter 104b in the second reading is 1, it may not adjust the upper count value. When the count value of the lower counter 104b before the inversion in the second reading is 0, it is necessary to add 1 to the upper count value. In the present embodiment, since the upper counter 101 performs the counting in the up-count mode, it may perform addition. In the present embodiment, at the time of the switching of the count clock, the switching of the count clock and the adjustment of the upper count value based on the digit-up and digit-down of the lower count value are all performed.

Figure 23:
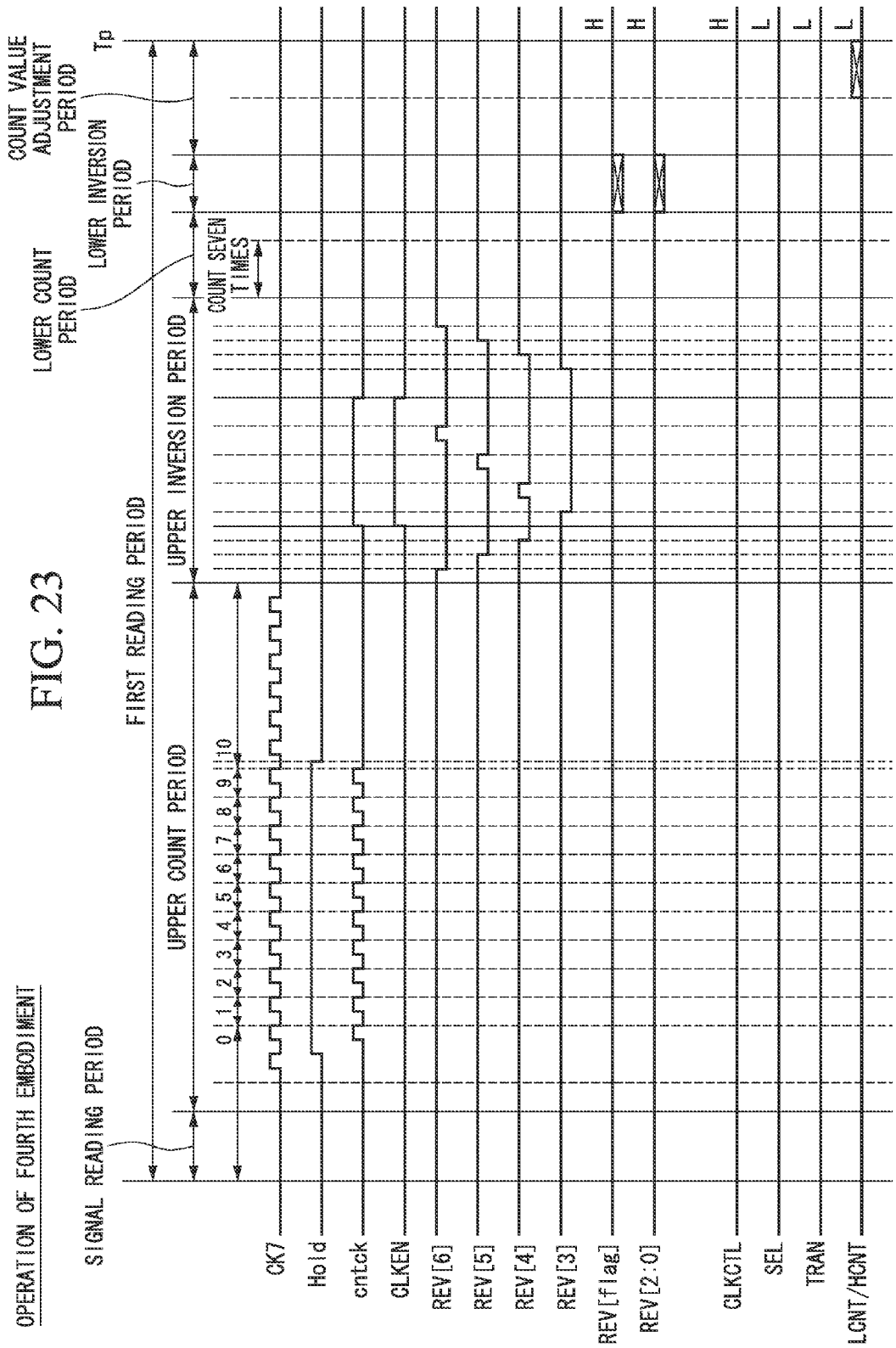
FIG. 23 is a timing chart illustrating an operation at the time of subtraction in a fourth embodiment of the present invention.
Figure 24:
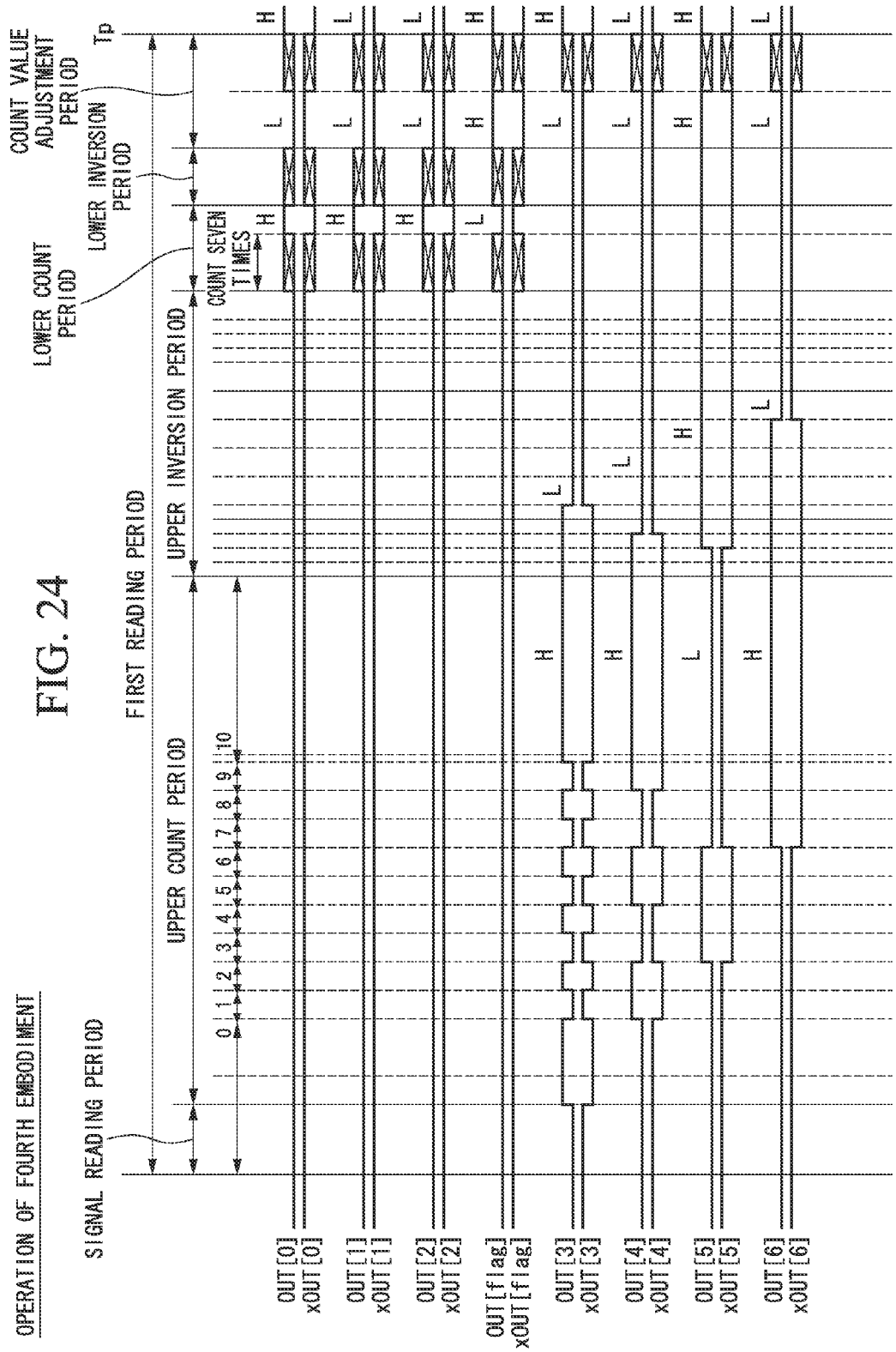
FIG. 24 is a timing chart illustrating an operation at the time of subtraction in a fourth embodiment of the present invention.
Figure 25:
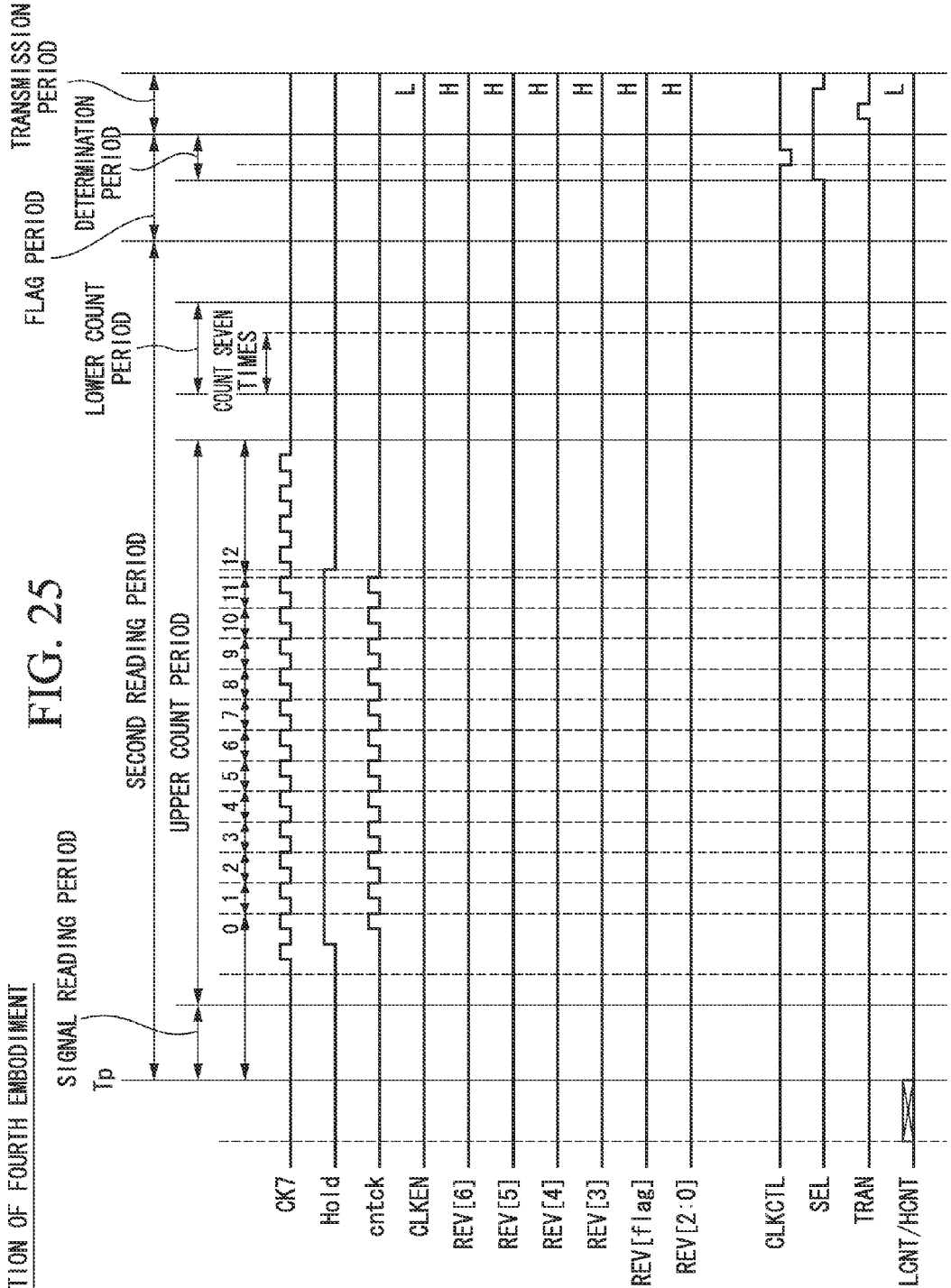
FIG. 25 is a timing chart illustrating an operation at the time of subtraction in a fourth embodiment of the present invention.
Figure 26:
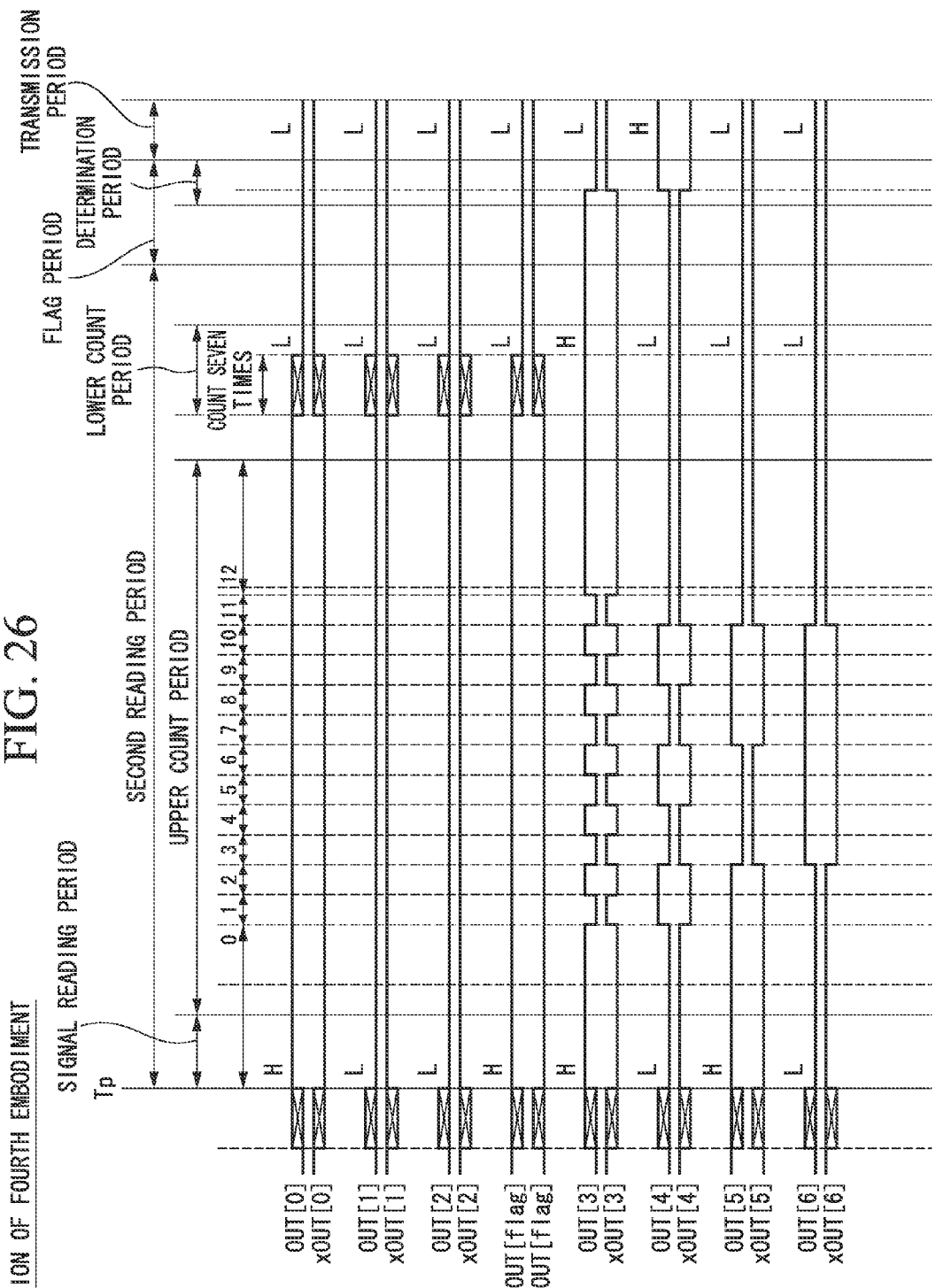
FIG. 26 is a timing chart illustrating an operation at the time of subtraction in a fourth embodiment of the present invention.

FIG. 23 to FIG. 26 illustrate waveforms of signals according to the operations of the present embodiment. FIG. 23 and FIG. 24 illustrate waveforms of signals at the time of the first reading, and FIG. 25 and FIG. 26 illustrate waveforms of signals at the time of the second reading. In FIG. 24 and FIG. 26, OUT[0], OUT[1], and OUT[2] indicate the output of the lower counter 104a, and xOUT[0], xOUT[1], and xOUT[2] indicate the inverted output of the lower counter 104a. OUT[flag] indicates the output of the lower counter 104b, and xOUT[flag] indicates the inverted output of the lower counter 104b. OUT[3], OUT[4], OUT[5], and OUT[6] indicate a unit of the output of the upper counter 101, and xOUT[3], xOUT[4], xOUT[5], and xOUT[6] indicate a unit of the inverted output of the upper counter 101. TRAN indicates a control signal that transmits digital data to the output unit 17.

The operations of the present embodiment are performed in a first reading period in which the first pixel signal is read and AD-converted, a second reading period in which the second pixel signal is read and AD-converted, a flag period in which the count clock of the upper counter 101 is switched, and a transmission period in which the digital data is transmitted. The first reading period includes a signal reading period in which the first pixel signal is read, an upper count period in which the upper counter 101 performs the counting, an upper inversion period in which the upper count value of the upper counter 101 is inverted, a lower count period in which the lower counter 104 (104a and 104b) performs the counting, a lower inversion period in which the lower count value of the lower counter 104 (104a and 104b) is inverted, and a count value adjustment period in which the lower count value of the lower counter 104 (104a and 104b) and the upper count value of the upper counter 101 according to the inversion are adjusted.

The second reading period includes a signal reading period in which the second pixel signal is read, an upper count period in which the upper counter 101 performs the counting, and a lower count period in which the lower counter 104 (104a and 104b) performs the counting. Furthermore, the flag period includes a clock setting period in which the modification unit 103 modifies the logic state of the count clock of the upper counter 101, and a determination period in which the modification of the logic state of the count clock of the upper counter 101 by the modification unit 103, the switching of the count clock of the upper counter 101, and the adjustment of the upper count value based on the digit-up and digit-down of the lower count value are performed.

Here, it is assumed that a state corresponding to the lower phase signal of the first pixel signal is the state 7, an upper count value based on the first pixel signal is 10, a state corresponding to the lower phase signal of the second pixel signal is the state 7, and an upper count value based on the second pixel signal is 12. That is, the first pixel signal corresponds to 87 (=7+8 10), the second pixel signal corresponds to 103 (=7+8 12), and a value obtained by subtracting (a CDS process) the first pixel signal from the second pixel signal is 16.

<<First Reading>>

Initially, the logic states of the latch circuits D_0 to D_7 are reset by the control signal LRST. Furthermore, the count values of the lower counters 104a and 104b are reset by the control signal CLRST. Simultaneously, the count value of the upper counter 101 is reset to a predetermined value (in this case, 9'b0000_0000_1) by the control signal CHSET. Since the control signal SEL has been set to an L state, the count clock of the upper counter 101 is set as the output of the latch circuit D_7 of the latch unit 108. Accordingly, until a comparison process is completed, the clock signal CK7 is input to the upper counter 101 through the latch circuit D_7 and the switching unit 109, and the upper counter 101 performs counting using the clock signal CK7 as a count clock. At the start time point of the comparison process in the upper count period subsequent to the signal reading period, values held by the lower counters 104a and 104b are 3'b[0]000 and a value held by the upper counter 101 is 9'b0000_0000_1. If these values are expressed in 12 bits, 12'b0000_0000_1000 is obtained.

In the upper count period, at a first timing (the first timing according to the comparison of the ramp wave applied from the ramp unit 19 and the reset level in the above-mentioned operation) satisfying predetermined conditions, the control signal Hold is inverted, and the states of the clock signals CK0 to CK7, which are the logic state of the VCO100 at that time, are held (the first lower phase signal). Simultaneously, the upper counter 101 stops the count operation. At this time, values held by the lower counters 104a and 104b are 3'b[0]000 and a value held by the upper counter 101 is 9'b0000_0101_1 (corresponding to 11). If these values are expressed in 12 bits, 12'b0000_0101_1000 is obtained.

Subsequently, in the upper inversion period, the count value of the upper counter 101 is inverted. At this time, values held by the lower counters 104a and 104b are 3'b[0]000 and a value held by the upper counter 101 is 9'b1111_1010_0 (corresponding to −12). If these values are expressed in 12 bits, 12'b1111_1010_0000 is obtained.

Subsequently, in the lower count period, a binarization process of the first lower phase signal is performed. Through the binarization process of the first lower phase signal, a count clock is output from the arithmetic unit 106 to the lower counter 104a, so that the lower counter 104a performs counting. In the present embodiment, the inverted output of the third bit of the lower counter 104a is input to the lower counter 104b. At the timing at which the output of the third bit of the lower counter 104a changes from "1" to "0," digit-up occurs in the count value of the lower counter 104a. By the digit-up, 1 is added to the count value of the lower counter 104b. At the completion time point of the binarization process of the first lower phase signal, values held by the lower counters 104a and 104b are 3'b[0]111 (corresponding to 7) and a value held by the upper counter 101 is 9'b1111_1010_0 (corresponding to −12). If these values are expressed in 12 bits, 12'b1111_1010_0111 is obtained.

Subsequently, in the lower inversion period, the count values of the lower counters 104a and 104b are inverted. At this time, values held by the lower counters 104a and 104b are 3'b[1]000 (corresponding to −8) and a value held by the upper counter 101 is 9'b1111_1010_0 (corresponding to −12). If these values are expressed in 12 bits, 12'b1111_1010_0000 is obtained.

Subsequently, in the count value adjustment period, the lower adjustment circuit 105 generates a count clock for adjustment corresponding to one pulse based on the control signal LCNT, and outputs the count clock for adjustment to the lower counters 104a and 104b. The lower counters 104a and 104b perform the counting based on the count clock for adjustment. By the counting, the count values of the lower counters 104a and 104b are increased by 1. Furthermore, the upper adjustment circuit 102 generates a count clock for adjustment corresponding to one pulse based on the control signal HCNT, and outputs the count clock for adjustment to the upper counter 101. The upper counter 101 performs the counting based on the count clock for adjustment. By the counting, the count value of the upper counter 101 is increased by 1. At this time, values held by the lower counters 104a and 104b are 3'b[1]001 (corresponding to −7) and a value held by the upper counter 101 is 9'b1111_1010_1 (corresponding to −11). If these values are expressed in 12 bits, 12'b1111_1010_1001 is obtained.

<<Second Reading>>

First, the latch circuits D_0 to D_7 are reset by the control signal LRST. Here, the count values of the lower counters 104a and 104b are not reset by the control signal CLRST and the count value of the upper counter 101 is not reset by the control signal CHSET. At this time, values held by the lower counters 104a and 104b are 3'b[1]001 (corresponding to −7) and a value held by the upper counter 101 is 9'b1111_1010_1 (corresponding to −11). If these values are expressed in 12 bits, 12'b1111_1010_1001 is obtained.

In the upper count period subsequent to the signal reading period, at a second timing (the second timing according to the comparison of the ramp wave applied from the ramp unit 19 and the signal level in the above-mentioned operation) satisfying predetermined conditions, the control signal Hold is inverted, and the states of the clock signals CK0 to CK7, which are the logic state of the VCO100 at that time, are held (the second lower phase signal). Simultaneously, the upper counter 101 stops the count operation. At this time, values held by the lower counters 104a and 104b are 3'b[1]001 (corresponding to −7) and a value held by the upper counter 101 is 9'b0000_0000_1 (corresponding to 1). If these values are expressed in 12 bits, 12'b0000_0000_1001 is obtained.

Subsequently, in the lower count period, a binarization process of the second lower phase signal is performed. Through the binarization process of the second lower phase signal, a count clock is output from the arithmetic unit 106 to the lower counter 104a, so that the lower counter 104a performs counting. In the present embodiment, the inverted output of the third bit of the lower counter 104a is input to the lower counter 104b. At the timing at which the output of the third bit of the lower counter 104a changes from "1" to "0," shift-up occurs in the count value of the lower counter 104a. By the shift-up, 1 is added to the count value of the lower counter 104b. At the completion time point of the binarization process of the first lower phase signal, values held by the lower counters 104a and 104b are 3'b[0]000 (corresponding to 0) and a value held by the upper counter 101 is 9'b0000_0000_1 (corresponding to 1). If these values are expressed in 12 bits, 12'b0000_0000_1000 is obtained.

Subsequently, in the flag period, the count clock input to the upper counter 101 is switched. In the present embodiment, the second count clock, which is a count clock after the switching, is the output of the lower counter 104b. Here, as the second count clock, an L state is output when the digit-up or digit-down occurs in the lower count value and an H state is output when no digit-up or digit-down occurs in the lower count value.

First, in the determination period of the flag period, the control signal SEL enters an H state from an L state, so that a count clock is switched to a count clock (the output of the modification unit 103) fixed to an H state by the control signal CLKCTL. Then, the control signal CLKCTL enters an L state from an H state. The inverted output of the lower counter 104b input to the modification unit 103 is in an L state and the control signal CLKCTL changes to the L state from the H state, so that 1 is added to the count value of the upper counter 101. At this time, values held by the lower counters 104a and 104b are 3'b[0]000 (corresponding to 0) and a value held by the upper counter 101 is 9'b0000_0001_0 (corresponding to 2). If these values are expressed in 12 bits, 12'b0000_0001_0000 is obtained.

In the transmission period, digital data including the second lower count value and the second upper count value is transmitted to the output unit 17 by the horizontal selection unit 14 through the horizontal signal line. Through the above operation, binary data corresponding to the difference between the first pixel signal and the second pixel signal is obtained.

As described above, according to the present embodiment, the modification unit 103 modifies the logic state of the count clock to a predetermined state at the time of the switching of the count clock, so that it is possible to prevent an error of the count value depending on the logic state of the count clock before the switching. Furthermore, since it is sufficient if the lower counters 104a and 104b and the upper counter 101 have only one type of count mode (the up-count mode in the present embodiment), it may realize the A/D conversion circuit using a simple circuit configuration.

Furthermore, the count value of the upper counter 101 is initially set as a predetermined value, so that it may adjust the count value of the upper counter 101 in response to the digit-down of the count values of the lower counter 104a and 104b, without a change in the count mode. Moreover, the lower adjustment circuit 105 and the upper adjustment circuit 102 output the count clocks for adjustment, and the lower counters 104a and 104b and the upper counter 101 perform the counting based on the count clocks for adjustment, so that it may perform the binary subtraction in conjunction with the inversion of the count value which is performed immediately before the counting.

So far, the embodiments of the present invention have been described with reference to the drawings. However, detailed configurations are not limited to the embodiments. For example, design modifications and the like can be made without departing from the scope of the present invention. The present invention is not limited to the aforementioned description, but is limited only by the range of the appended claims.

What is claimed is:

1. An A/D conversion circuit comprising:
a reference signal generation unit that generates a reference signal increasing or decreasing through time;
a comparison unit that compares an analog signal to be subjected to A/D conversion with the reference signal, and completes a comparison process at a timing at which the reference signal satisfies a predetermined condition with respect to the analog signal;
a delay circuit that includes a plurality of delay elements connected to one another to delay a pulse signal, and outputs a lower phase signal being configured with output signals from the plurality of delay elements;
a latch unit that latches a second lower phase signal at a second timing at which the comparison process for a second analog signal is completed after latching a first lower phase signal at a first timing at which the comparison process for a first analog signal is completed;
an arithmetic unit that generates a second lower count signal in response to the second lower phase signal held by the latch unit after generating a first lower count signal in response to the first lower phase signal held by the latch unit;
a lower counter that is configured with a first binary counter that acquires a first lower count value by performing counting using the first lower count signal as a count clock and inverts values of bits constituting the first lower count value, and then acquires a second lower count value by performing counting using the second lower count signal as a count clock and outputs an upper count clock based on a flag bit of the second lower count value;
an upper counter that is configured with a second binary counter that acquires a first upper count value by performing counting using one output signal, which constitutes the first lower phase signal output from the delay circuit, as a count clock and inverts values of each bits constituting the first upper count value, and then acquires a second upper count value by performing counting using one output signal, which constitutes the second lower phase signal output from the delay circuit, as a count clock, and further performing counting based on the upper count clock; and
a modification unit that modifies a logic state of a count clock to a predetermined state when the count clock of the upper counter is switched,
wherein digital data corresponding to a difference between the first analog signal and the second analog signal is acquired.

2. The A/D conversion circuit according to claim 1, wherein the upper counter further has a data setting function of setting an upper count value of the second binary counter when performing counting using the one output signal, which constitutes the first lower phase signal output from the delay circuit, as the count clock.

3. The A/D conversion circuit according to claim 1, further comprising:
an adjustment unit that outputs an adjustment signal for adjusting the lower count value held by the first binary counter or the upper count value held by the second binary counter to the first binary counter or the second binary counter, as a count clock.

4. The A/D conversion circuit according to claim 1, wherein the delay circuit is a ring-like delay circuit in which the plurality of delay elements are connected in a ring shape.

5. An imaging device comprising:
an imaging unit in which a plurality of pixels including a photoelectric conversion element are arranged, wherein the plurality of pixels output a first pixel signal corresponding to a reset level at a first time and output a second pixel signal corresponding to an amount of an incident electromagnetic wave at a second time; and
the A/D conversion circuit according to any one of claims 1 to 4,
wherein the first pixel signal is used as the first analog signal and the second pixel signal is used as the second analog signal.

* * * * *